United States Patent
Kim et al.

(10) Patent No.: US 12,021,073 B2
(45) Date of Patent: Jun. 25, 2024

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Juhyeon Kim, Cheonan-si (KR); Hyoeun Kim, Cheonan-si (KR); Sunkyoung Seo, Cheonan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 279 days.

(21) Appl. No.: 17/656,011

(22) Filed: Mar. 23, 2022

(65) Prior Publication Data

US 2023/0013176 A1    Jan. 19, 2023

(30) Foreign Application Priority Data

Jul. 15, 2021    (KR) .......................... 10-2021-0093130

(51) Int. Cl.
*H01L 21/768*    (2006.01)
*H01L 21/78*    (2006.01)
(Continued)

(52) U.S. Cl.
CPC ........ *H01L 25/50* (2013.01); *H01L 21/76898* (2013.01); *H01L 21/78* (2013.01); *H01L 24/03* (2013.01); *H01L 24/80* (2013.01); *H01L 24/94* (2013.01); *H01L 24/97* (2013.01); *H01L 24/08* (2013.01); *H01L 24/13* (2013.01); *H01L 25/0657* (2013.01); *H01L 2224/0401* (2013.01); *H01L 2224/08146* (2013.01); *H01L 2224/80001* (2013.01); *H01L 2225/06541* (2013.01)

(58) Field of Classification Search
CPC ...... H01L 25/50; H01L 25/0657; H01L 24/80
See application file for complete search history.

(56) References Cited

U.S. PATENT DOCUMENTS 8,853,830 B2    10/2014    Chang et al.
9,087,821 B2    7/2015    Lin
(Continued)

FOREIGN PATENT DOCUMENTS

CN    101582407    11/2009

*Primary Examiner* — Dale E Page
*Assistant Examiner* — Wilner Jean Baptiste
(74) *Attorney, Agent, or Firm* — F. Chau & Associates, LLC

(57) ABSTRACT

A method of manufacturing a semiconductor package includes preparing a wafer structure having a first semiconductor substrate and a plurality of first front surface connection pads. A lower semiconductor chip having a preliminary semiconductor substrate and a plurality of second front surface connection pads are attached to the wafer structure such that the plurality of first front surface connection pads and the plurality of second front surface connection pads correspond to each other. A plurality of bonding pads is formed by bonding together the plurality of first front surface connection pads and the plurality of second front surface connection pads corresponding to each other. A second semiconductor substrate having a horizontal width that is less than that of the second wiring structure is formed by removing a portion of the preliminary semiconductor substrate.

20 Claims, 27 Drawing Sheets

(51) Int. Cl.
  *H01L 23/00*   (2006.01)
  *H01L 25/00*   (2006.01)
  *H01L 25/065*  (2023.01)

(56) References Cited

U.S. PATENT DOCUMENTS

| | | | |
|---|---|---|---|
| 9,240,398 | B2 | 1/2016 | Fujimori et al. |
| 9,305,899 | B2 | 4/2016 | Park et al. |
| 10,141,286 | B2 * | 11/2018 | Lee .................... H01L 23/3114 |
| 10,756,010 | B2 | 8/2020 | Yu et al. |
| 10,790,211 | B2 | 9/2020 | Luo et al. |
| 10,804,177 | B2 | 10/2020 | Luo et al. |
| 10,867,985 | B2 | 12/2020 | Yu et al. |
| 10,886,232 | B2 * | 1/2021 | Chen ....................... H01L 24/97 |
| 10,930,617 | B2 | 2/2021 | Liu |
| 10,930,633 | B2 | 2/2021 | Chen et al. |
| 2020/0411472 | A1 | 12/2020 | Chung et al. |
| 2021/0057362 | A1 | 2/2021 | Chen et al. |

* cited by examiner

SEMICONDUCTOR PACKAGE AND METHOD OF MANUFACTURING THE SAME

CROSS-REFERENCE TO RELATED APPLICATION

This application is based on and claims priority under 35 U.S.C. § 119 to Korean Patent Application No. 10-2021-0093130, filed on Jul. 15, 2021, in the Korean Intellectual Property Office, the disclosure of which is incorporated by reference herein in its entirety.

TECHNICAL FIELD

The present disclosure relates to semiconductors and, more specifically, to a semiconductor package and a method of manufacturing the same.

DISCUSSION OF THE RELATED ART

In accordance with the rapid development of the electronics industry and user demand, electronic devices have become smaller, more multifunctional, and larger in capacity. Accordingly, semiconductor packages including a plurality of semiconductor chips have been developed in response to multifunctionality and large capacity. Also, semiconductors packages having a plurality of stacked semiconductor chips have been developed in response to miniaturization.

SUMMARY

A method of manufacturing a semiconductor package includes preparing a wafer structure having a first semiconductor substrate, a first wiring structure disposed on the first semiconductor substrate, and a plurality of first front surface connection pads of which at least portions are buried in the first wiring structure. A lower semiconductor chip having a preliminary semiconductor substrate, a plurality of through electrodes buried in the preliminary semiconductor substrate, a second wiring structure disposed on the preliminary semiconductor substrate, and a plurality of second front surface connection pads are each disposed on the wafer structure. Of the plurality of second front surface connection pads, at least portions are buried in the second wiring structure, such that the plurality of first front surface connection pads and the plurality of second front surface connection pads correspond to each other. A plurality of bonding pads is formed by bonding together the plurality of first front surface connection pads and the plurality of second front surface connection pads corresponding to each other. A second semiconductor substrate is formed having a horizontal width that is less than that of the second wiring structure, by removing a portion of the preliminary semiconductor substrate such that the plurality of through electrodes are exposed.

A method of manufacturing a semiconductor package includes preparing a wafer structure having a first semiconductor substrate on which a plurality of first semiconductor devices are disposed, a first wiring structure disposed on the first semiconductor substrate, and a plurality of first front surface connection pads of which at least portions are buried in the first wiring structure. A plurality of lower semiconductor chips spaced apart from each other are disposed on the wafer structure. The plurality of lower semiconductor chips each have a preliminary semiconductor substrate on which a second semiconductor device is disposed. A plurality of through electrodes is buried in the preliminary semiconductor substrate. A second wiring structure is disposed on the preliminary semiconductor substrate. A plurality of second front surface connection pads, of which at least portions are buried in the second wiring structure such that the plurality of first front surface connection pads and the plurality of second front surface connection pads correspond to each other, is formed on the wafer structure. A plurality of bonding pads is formed by bonding together the plurality of first front surface connection pads and the plurality of second front surface connection pads corresponding to each other. A second semiconductor substrate having a horizontal width that is less than that of the second wiring structure is formed by removing a portion of the preliminary semiconductor substrate such that portions of the plurality of through electrodes protrude. A filling insulating layer covering the plurality of lower semiconductor chips, at least partially surrounding protruding portions of the plurality of through electrodes, and exposing the plurality of through electrodes is formed on the wafer structure. A redistribution structure including a plurality of redistribution patterns electrically connected to the plurality of through electrodes is formed on the filling insulating layer and the plurality of through electrodes. A plurality of semiconductor packages, each including one of the plurality of lower semiconductor chips and an upper semiconductor chip disposed on the one of the plurality of lower semiconductor chips and having one of the plurality of first semiconductor devices, is formed by performing a sawing process on the wafer structure, the filling insulating layer, and the redistribution structure.

A method of manufacturing a semiconductor package includes preparing a wafer structure having a first semiconductor substrate on which a plurality of first semiconductor devices are disposed, a first wiring structure disposed on the first semiconductor substrate and having a first wiring insulating layer, and a plurality of first front surface connection pads of which side surfaces are covered by the first wiring insulating layer. A plurality of lower semiconductor chips spaced apart from each other is formed on the wafer structure. The plurality of lower semiconductor chips each have a preliminary semiconductor substrate on which a second semiconductor device is disposed, a plurality of through electrodes buried in the preliminary semiconductor substrate, a second wiring structure disposed on the preliminary semiconductor substrate and having a second wiring insulating layer, and a plurality of second front surface connection pads of which side surfaces are covered by the second wiring insulating layer, such that the plurality of first front surface connection pads and the plurality of second front surface connection pads correspond to each other. A plurality of bonding pads is formed by bonding together the plurality of first front surface connection pads and the plurality of second front surface connection pads corresponding to each other, through diffusion bonding. A second semiconductor substrate is formed by removing a portion corresponding to a removal thickness from an upper surface of the preliminary semiconductor substrate and a portion corresponding to a removal width from a side surface of the preliminary semiconductor substrate, such that portions of the plurality of through electrodes protrude. The second semiconductor substrate has an edge positioned further inside than an edge of the second wiring structure and a thickness that is less than the removal width. A filling insulating layer at least partially surrounding protruding portions of the plurality of through electrodes, covering the plurality of lower semiconductor chips, and exposing the plurality of through electrodes is formed on the wafer structure. A redistribution structure including a plurality of redistribution patterns electrically connected to the plurality of through electrodes is formed on the filling insulating layer and the plurality of through electrodes. A plurality of semiconductor packages each including one of the plurality of lower semiconductor chips and an upper semiconductor chip disposed on the one of the plurality of lower semiconductor chips and having one of the plurality of first semiconductor devices, is formed by performing a sawing process on the wafer structure, the filling insulating layer, and the redistribution structure, such that an edge of the second semiconductor substrate, an edge of the first wiring structure, an edge of the upper semiconductor chip, an edge of the filling insulating layer, and an edge of the redistribution structure are aligned with each other in a vertical direction.

A semiconductor package includes a redistribution structure including a plurality of redistribution patterns and a redistribution insulating layer at least partially surrounding the plurality of redistribution patterns. An upper semiconductor chip includes a first wiring structure and a first semiconductor substrate disposed on the first wiring structure. The first wiring structure includes a plurality of first wiring layers, a plurality of first via plugs, and a first wiring insulating layer at least partially surrounding the plurality of first wiring layers and the plurality of first via plugs. A lower semiconductor chip is disposed on the redistribution structure and the upper semiconductor chip and the lower semiconductor chip includes a second semiconductor substrate disposed on the redistribution structure and a second wiring structure disposed on the second semiconductor substrate and including a plurality of second wiring layers, a plurality of second via plugs, and a second wiring insulating layer at least partially surrounding the plurality of second wiring layers and the plurality of second via plugs. In a plan view, an edge of the second wiring structure is spaced apart from each of an edge of the upper semiconductor chip and an edge of the second semiconductor substrate, and the edge of the second wiring structure extends along a space between the edge of the upper semiconductor chip and the edge of the second semiconductor substrate. A plurality of bonding pads is at least partially surrounded by the first wiring insulating layer and the second wiring insulating layer and is electrically connecting the plurality of first via plugs to the plurality of second via plugs.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
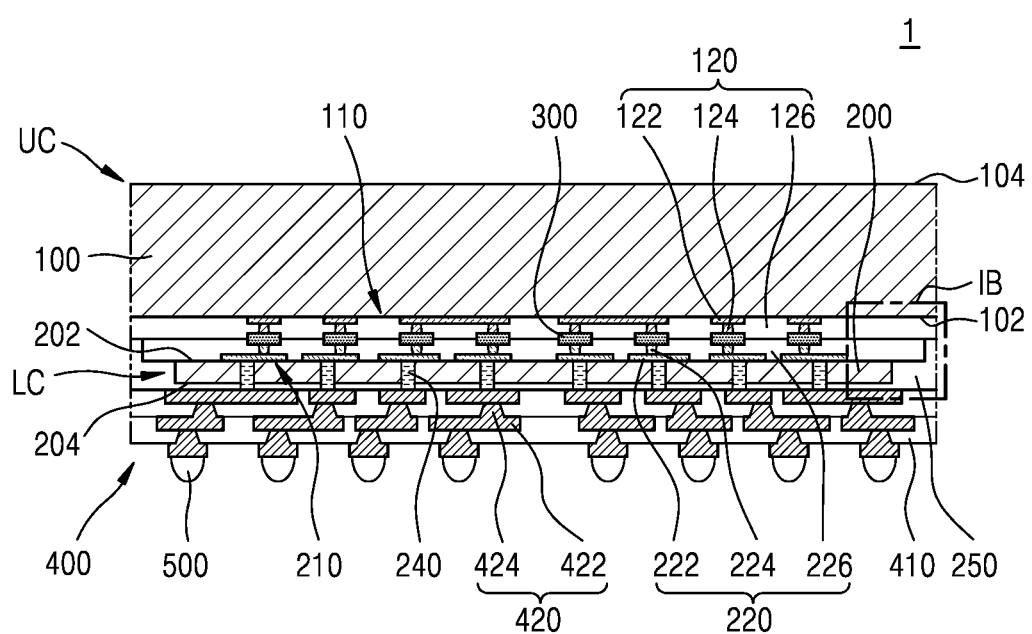
FIGS. 1A and 1B are cross-sectional views illustrating a semiconductor package according to an embodiment of the inventive concept.
Figure 1B:
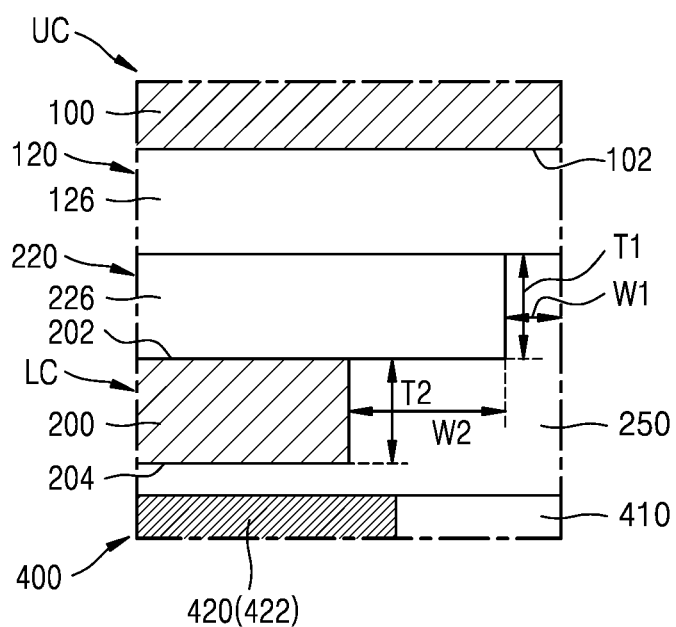
Figure 1C:
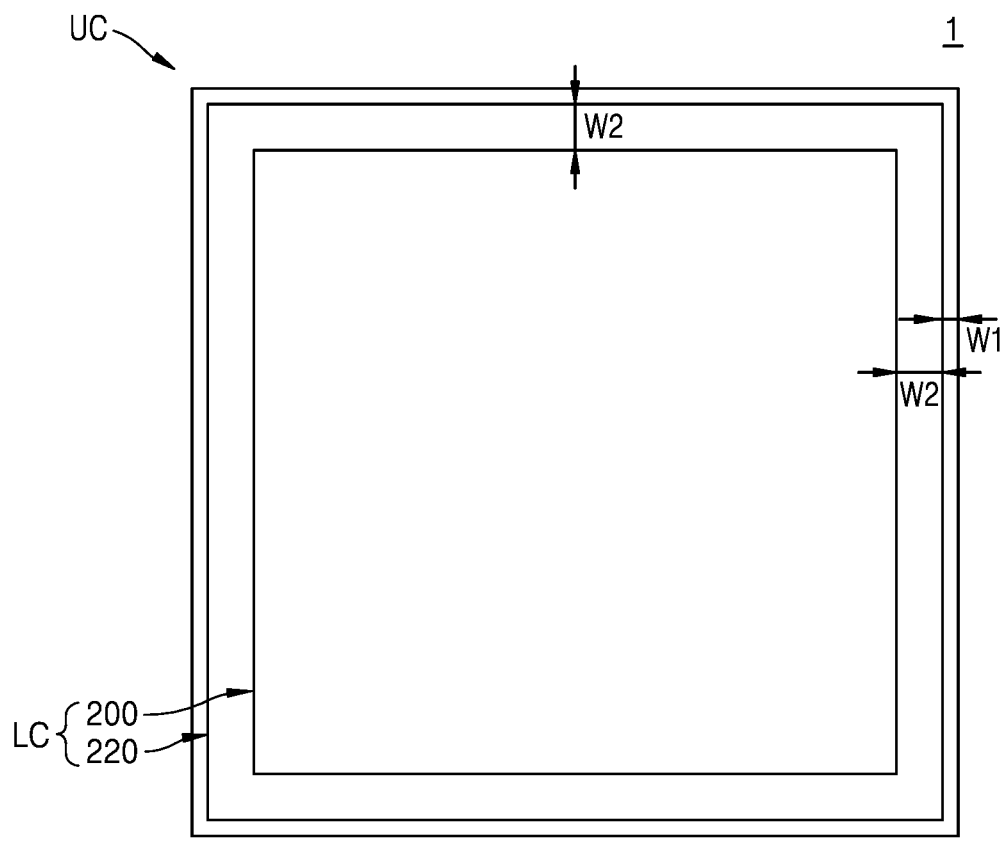
FIG. 1C is a plan view illustrating a semiconductor package according to an embodiment of the inventive concept.

FIGS. 1A and 1B are cross-sectional views and FIG. 1C is a plan view illustrating a semiconductor package 1 according to an embodiment of the inventive concept. In detail, FIG. 1B is an enlarged cross-sectional view of a region IB of FIG. 1A, and FIG. 1C is a plan view illustrating some components of the semiconductor package 1.

Referring to FIGS. 1A to 1C together, the semiconductor package 1 may include a redistribution structure 400, a lower semiconductor chip LC disposed on the redistribution structure 400, and an upper semiconductor chip UC stacked on the lower semiconductor chip LC. The upper semiconductor chip UC may be referred to as a first semiconductor chip, and the lower semiconductor chip LC may be referred to as a second semiconductor chip.

The upper semiconductor chip UC may include a first semiconductor substrate 100 and a first wiring structure 120 disposed on the first semiconductor substrate 100. The lower semiconductor chip LC may include a second semiconductor substrate 200 and a second wiring structure 220 disposed on the second semiconductor substrate 200. The first wiring structure 120 and the second wiring structure 220 may be referred to as a first back-end-of-line (BEOL) structure and a second BEOL structure, respectively.

The first semiconductor substrate 100 and the second semiconductor substrate 200 may each include, for example, silicon (Si). Alternatively, the first semiconductor substrate 100 and the second semiconductor substrate 200 may each include a semiconductor element such as germanium (Ge), or a compound semiconductor such as silicon carbide (SiC), gallium arsenide (GaAs), indium arsenide (InAs), or indium phosphide (InP). Alternatively, the first semiconductor substrate 100 and the second semiconductor substrate 200 may have a silicon on insulator (SOI) structure. For example, the first semiconductor substrate 100 and the second semiconductor substrate 200 may each include a buried oxide (BOX) layer. The first semiconductor substrate 100 and the second semiconductor substrate 200 may each include a conductive region, for example, a well doped with impurities, or a structure doped with impurities. In addition, the first semiconductor substrate 100 and the second semiconductor substrate 200 may each have various device isolation structures such as a shallow trench isolation (STI) structure. The first semiconductor substrate 100 may have a first surface 102 that is an active surface and a second surface 104 that is an inactive surface opposite to the first surface 102. The second semiconductor substrate 200 may have a third surface 202 that is an active surface and a fourth surface 204 that is an inactive surface opposite to the third surface 202. The first surface 102 and the third surface 202 may face each other, and the second surface 104 and the fourth surface 204 may be arranged opposite to each other. The first surface 102, the second surface 104, the third surface 202, and the fourth surface 204 may be referred to as a first active surface, a first inactive surface, a second active surface, and a second inactive surface, respectively.

For example, a first semiconductor device 110 may be disposed on the first surface 102 of the first semiconductor substrate 100, and the first wiring structure 120 may be disposed on the first surface 102 of the first semiconductor substrate 100. For example, a second semiconductor device 210 may be disposed on the third surface 202 of the second semiconductor substrate 200, and the second wiring structure 220 may be disposed on the third surface 202 of the first semiconductor substrate 200.

In the present specification, unless otherwise stated, components including the terms "front surface" and "rear surface" refer to a component disposed on an active surface and a component disposed on inactive surface, respectively. In addition, unless otherwise stated, the terms "upper surface" and "lower surface (bottom surface)" refer to a surface of an upper side and a surface of a lower side in the drawings, respectively.

In some embodiments, the first semiconductor device 110 may include, for example, a memory device, and the second semiconductor device 210 may include, for example, a central processing unit (CPU), a graphic processing unit (GPU), or an application processor (AP). For example, the first semiconductor device 110 may include a volatile memory device such as a dynamic random access memory (DRAM) device or a static random access memory (SRAM) device, or a non-volatile memory device such as a phase-change random access memory (PRAM) device, a magnetoresistive random access memory (MRAM) device, a ferroelectric random access memory (FeRAM) device, or a resistive random access memory (RRAM) device. In some embodiments, the first semiconductor device 110 may be a high bandwidth memory (HBM) DRAM device.

The first wiring structure 120 may be disposed on the first surface 102 of the first semiconductor substrate 100, and the second wiring structure 220 may be disposed on the third surface 202 of the second semiconductor substrate 200. The first wiring structure 120 may include a plurality of first wiring layers 122, a plurality of first via plugs 124, and a first wiring insulating layer 126 at least partially surrounding the plurality of first wiring layers 122 and the plurality of first via plugs 124. The second wiring structure 220 may include a plurality of second wiring layers 222, a plurality of second via plugs 224, and a second wiring insulating layer 226 at least partially surrounding the plurality of second wiring layers 222 and the plurality of second via plugs 224.

For example, each of the first wiring layer 122, the first via plug 124, the second wiring layer 222, and the second via plug 224 may include a metal material such as W, Cu, Ti, Ta, Ru, Mn, or Co, a nitride or oxide of a metal such as Ti, Ta, Ru, Mn, Co, or W, cobalt tungsten phosphide (CoWP), cobalt tungsten boron (CoWB), cobalt tungsten boron phosphide (CoWBP), or a combination thereof.

For example, each of the first wiring insulating layer 126 and the second wiring insulating layer 226 may include silicon oxide (SiO), silicon nitride (SiN), silicon oxynitride (SiON), silicon carbonitride (SiCN), silicon oxycarbide (SiOC), a polymer material, and/or an insulating material having a lower dielectric constant than SiO. The polymer material may include benzocyclobutene (BCB), polyimide (PI), polybenzoxazole (PBO), silicone, acrylate, or epoxy. Each of the first wiring insulating layer 126 and the second wiring insulating layer 226 may include, for example, a tetraethyl orthosilicate (TEOS) layer. Alternatively, each of the first wiring insulating layer 126 and the second wiring insulating layer 226 may include an ultra low K (ULK) layer having an ultra low dielectric constant K of about 2.2 to about 2.4, or less. The ULK layer may include a SiOC layer or a SiCOH layer. In some embodiments, a lower portion of the first wiring insulating layer 126 and an upper portion of the second wiring insulating layer 226, which are portions where the first wiring insulating layer 126 and the second wiring insulating layer 226 contact each other, may include SiCN.

The upper semiconductor chip UC may be stacked on the lower semiconductor chip LC such that the first active surface and the second active surface, for example, the first surface 102 and the third surface 202 face each other, and the first inactive surface and the second inactive surface, for example, the second surface 104 and the fourth surface 204 are opposite to each other. The upper semiconductor chip UC may be stacked on the lower semiconductor chip LC such that the first wiring structure 120 of the upper semiconductor chip UC and the second wiring structure 220 of the lower semiconductor chip LC face each other. The first wiring structure 120 and the second wiring structure 220 may contact each other. For example, the first wiring insulating layer 126 of the first wiring structure 120 and the second wiring insulating layer 226 of the second wiring structure 220 may directly contact each other.

The lower semiconductor chip LC may have a plurality of through electrodes 240 penetrating the second semiconductor substrate 200. The through electrode 240 may extend between the third surface 202 and the fourth surface 204 of the second semiconductor substrate 200. At least a portion of the through electrode 240 may have a pillar shape.

The through electrode 240 may include a conductive plug penetrating the second semiconductor substrate 200 and a conductive barrier layer at least partially surrounding the conductive plug. The conductive plug may have a cylindrical shape, and the conductive barrier layer may have a cylindrical shape at least partially surrounding a sidewall of the conductive plug. The conductive plug may include Cu, CuSn, CuMg, CuNi, CuZn, CuPd, CuAu, CuRe, CuW, W, or a W alloy, but is not necessarily limited thereto. The conductive plug may include, for example, Al, Au, Be, Bi, Co, Cu, Hf, In, Mn, Mo, Ni, Pb, Pd, Pt, Rh, Re, Ru, Ta, Te, Ti, W, Zn, and/or Zr, and may include a stacked structure of one or more of the materials described above. The conductive barrier layer may include, for example, W, WN, WC, Ti, TiN, Ta, TaN, Ru, Co, Mn, WN, Ni, and/or NiB, but is not necessarily limited thereto.

A via insulation layer may be disposed between the second semiconductor substrate 200 and the through electrode 240 to at least partially surround a sidewall of the through electrode 240. The via insulating layer may include an oxide layer, a nitride layer, a carbide layer, a polymer, or a combination thereof. The via insulating layer may include, for example, a high aspect ratio process (HARP) oxide layer based on ozone/tetra-ethyl ortho-silicate (O3/TEOS).

In FIG. 1A, the through electrode 240 is illustrated as having a via-middle structure in which one end thereof is connected to the second wiring layer 222 of the second wiring structure 220, but is not necessarily limited thereto. The through electrode 240 may have any one of a via-first structure, a via-middle structure, and a via-last structure.

The through electrode 240 may fully penetrate the second semiconductor substrate 200 from one end thereof to the other end thereof, so that the other end of the through electrode 240 may be exposed on the fourth surface 204 of the second semiconductor substrate 200. In some embodiments, the through electrode 240 may have a shape in which the other end thereof protrudes from the fourth surface 204 of the second semiconductor substrate 200. The other end of the through electrode 240 may be connected to a redistribution pattern 420 of the redistribution structure 400.

A plurality of bonding pads 300 may be disposed between the upper semiconductor chip UC and the lower semiconductor chip LC. The plurality of bonding pads 300 may electrically connect the upper semiconductor chip UC to the lower semiconductor chip LC. The upper semiconductor chip UC may be electrically connected to the redistribution pattern 420 of the redistribution structure 400 through the bonding pad 300, the second wiring layer 222 and the second via plug 224 of the second wiring structure 220, and the through electrode 240.

The first via plug 124 may be connected to an upper surface of each of the plurality of bonding pads 300, and the second via plug 224 may be connected to a lower surface of each of the plurality of bonding pads 300. The plurality of bonding pads 300 may be at least partially surrounded by the first wiring insulating layer 126 and the second wiring insulating layer 226. A portion of each of the plurality of bonding pads 300 may be buried in the first wiring insulating layer 126, and a remaining portion of each of the plurality of bonding pads 300 may be buried in the second wiring insulating layer 226. For example, in an upper portion of each of the plurality of bonding pads 300, a remaining portion excluding a portion of the upper surface to which the first via plug 124 is connected may be at least partially surrounded by the first wiring insulating layer 126. Also, in a lower portion of each of the plurality of bonding pads 300, a remaining portion excluding a portion of the lower surface to which the second via plug 224 is connected may be at least partially surrounded by the second wiring insulating layer 226.

The redistribution structure 400 may include at least one redistribution insulating layer 410 and a plurality of redistribution patterns 420. The plurality of redistribution patterns 420 may include a plurality of redistribution line patterns 422 and a plurality of redistribution vias 424. In some embodiments, the redistribution structure 400 may include a plurality of stacked redistribution insulating layers 410. The redistribution insulating layer 410 may include, for example, photo imageable dielectric (PID) or photosensitive polyimide (PSPI). The plurality of redistribution patterns 420 including the plurality of redistribution line patterns 422 and the plurality of redistribution vias 424 may include, for example, a metal such as Cu, Al, W, Ti, Ta, In, Mo, Mn, Co, Sn, Ni, Mg, Re, Be, Ga, or Ru, or an alloy thereof, but are not necessarily limited thereto. In some embodiments, the plurality of redistribution patterns 420 may be formed by stacking a metal or a metal alloy on a seed layer including Ti, titanium nitride (TiN), or titanium tungsten (TiW).

The plurality of redistribution line patterns 422 may be disposed on upper and/or lower surfaces of the redistribution insulating layer 410. The plurality of redistribution vias 424 may penetrate at least one redistribution insulating layer 410 to respectively contact some of the plurality of redistribution line patterns 422 and be connected thereto.

In some embodiments, the plurality of redistribution vias 424 may have a tapered shape in which a horizontal width of the redistribution via 424 decreases upwards and extends. For example, the plurality of redistribution vias 424 may have horizontal widths increasing away from the lower semiconductor chip LC.

In some embodiments, at least some of the plurality of redistribution line patterns 422 may be integrally formed with some of the plurality of redistribution vias 424. The redistribution via 424 may be integrally formed with the redistribution line pattern 422 contacting a surface having a large horizontal width from among upper and lower surfaces of the redistribution via 424. For example, the redistribution line pattern 422 and the redistribution via 424 contacting the upper surface of the redistribution line pattern 422 may be integrally formed. As used herein, the phrase "integrally formed" may mean that multiple elements are formed as one continuous structure, without disjoins or breaks therein.

Some of the plurality of redistribution line patterns 422 disposed on an upper surface of the redistribution structure 400 may be referred to as redistribution upper pads, and some of plurality of the redistribution line patterns 422 disposed on a lower surface of the redistribution structure 400 may be referred to as redistribution lower pads. The through electrode 240 of the lower semiconductor chip LC may be connected to the redistribution upper pad, and an external connection terminal 500 may be attached to the redistribution lower surface pad. The external connection terminal 500 may electrically connect the semiconductor package 1 to the outside. In some embodiments, the external connection terminal 500 may be a bump, a solder ball, etc.

A filling insulating layer 250 may be disposed between the redistribution structure 400 and the lower semiconductor chip LC. In some embodiments, the filling insulating layer 250 may include a material different from that of at least a portion of each of the first wiring insulating layer 126 and the second wiring insulating layer 226. For example, the filling insulating layer 250 may include SiO, and at least a portion of each of the first wiring insulating layer 126 and the second wiring insulating layer 226 may include SiN, SiON, SiCN, SiOC, a polymer material, and/or an insulating material having a lower dielectric constant than SiO.

A horizontal width and a horizontal area of the lower semiconductor chip LC may have values that are less than those of a horizontal width and a horizontal area of the upper semiconductor chip UC. As shown in FIG. 1C, in a plan view, an edge of the lower semiconductor chip LC may be spaced apart from an edge of the upper semiconductor chip UC to be positioned further inside than the edge of the upper semiconductor chip UC. In a plan view, the edge of the lower semiconductor chip LC may be spaced apart from the edge of the upper semiconductor chip UC with a first width W1 therebetween in a horizontal direction. The first width W1 may have a value of about 10 μm or more. The first width W1 may have different values depending on a space between corresponding edges from among four edges of each of the lower semiconductor chip LC and the upper semiconductor chip UC. For example, as shown in FIG. 1C, a separation distance between respective upper edges of the lower semiconductor chip LC and the upper semiconductor chip UC, a separation distance between respective lower edges of the lower semiconductor chip LC and the upper semiconductor chip UC, a separation distance between respective left edges of the lower semiconductor chip LC and the upper semiconductor chip UC, and/or a separation distances between respective right edges of the lower semiconductor chip LC and the upper semiconductor chip UC may have different values.

A horizontal width and a horizontal area of the second semiconductor substrate 200 of the lower semiconductor chip LC may have values that are less than those of a horizontal width and a horizontal area of the second wiring structure 220 of the lower semiconductor chip LC. The edge of the lower semiconductor chip LC may be an edge of the second wiring structure 220. Accordingly, the lower semiconductor chip LC may have a step shape having a step difference at a boundary between the second semiconductor substrate 200 and the second wiring structure 220.

As shown in FIG. 1C, in a plan view, an edge of the second semiconductor substrate 200 may be spaced apart from an edge of the second wiring structure 220 to be positioned further inside than the edge of the second wiring structure 220. In a plan view, the edge of the second wiring structure 220 may be spaced apart from each of the edges of the upper semiconductor chip UC and the second semiconductor substrate 200, and may extend along a space between the edges of the upper semiconductor chip UC and the second semiconductor substrate 200. In a plan view, the edge of the second semiconductor substrate 200 may be spaced apart from the edge of the second wiring structure 220 with a second width W2 therebetween in the horizontal direction. The second width W2 may have a value of about 15 μm to about 45 μm. The second width W2 may have substantially the same value between corresponding edges from among four edges of each of the second semiconductor substrate 200 and the second wiring structure 220. For example, as shown in FIG. 1C, a separation distance between respective upper edges of the second semiconductor substrate 200 and the second wiring structure 220, a separation distance between respective lower edges of the second semiconductor substrate 200 and the second wiring structure 220, a separation distance between respective left edges of the second semiconductor substrate 200 and the second wiring structure 220, and a separation distance between respective right edges of the second semiconductor substrate 200 and the second wiring structure 220 may have substantially the same value. For example, respective edges of the second semiconductor substrate 200 and the second wiring structure 220 may have substantially the same value as a whole, and may be spaced apart from each other in the horizontal direction. For example, a horizontal width of the second wiring structure 220 may have a value that is greater than that of a horizontal width of the second semiconductor substrate 200 by twice the second width W2.

The second wiring structure 220 may have a first thickness T1, and the second semiconductor substrate 200 may have a second thickness T2. In some embodiments, the first thickness T1 may have a value of about 5 μm to about 15 μm, and the second thickness T2 may have a value of about 5 μm to about 15 μm. In some embodiments, the first thickness T1 and the second thickness T2 may have substantially the same value. The second thickness T2 may have a value that is less than that of the second width W2. For example, the second width W2 may have a value about 2 to about 4 times greater than that of the second thickness T2.

The second width W2 may be formed as a width of the second semiconductor substrate 200 and this width may also be reduced in a process of reducing a thickness of the second semiconductor substrate 200, and the lower semiconductor chip LC may be included in the semiconductor package 1 with a thickness thereof reduced by approximately the second width W2.

The filling insulating layer 250 may be disposed between the upper semiconductor chip UC and the redistribution structure 400, and may at least partially surround the lower semiconductor chip LC. For example, the filling insulating layer 250 may cover side surfaces of the second semiconductor substrate 200 and the second wiring structure 220 of the lower semiconductor chip LC. In some embodiments, the filling insulating layer 250 may be further disposed between the lower semiconductor chip LC and the redistribution structure 400 to at least partially surround a portion of the through electrode 240 protruding from the fourth surface 204 of the second semiconductor substrate 200.

An upper surface of the filling insulating layer 250 and an upper surface of the lower semiconductor chip LC, for example, an upper surface of the second wiring structure 220 may be located at the same vertical level to be coplanar, and a lower surface of the filling insulating layer 250 and the other end of the through electrode 240 may be located at the same vertical level to be coplanar.

In some embodiments, respective edges of the upper semiconductor chip UC, the filling insulating layer 250, and the redistribution structure 400 may be aligned with each other in a vertical direction. For example, respective edges of the first semiconductor substrate 100, the first wiring insulating layer 126, the filling insulating layer 250, and the redistribution insulating layer 410 may be aligned with each other in the vertical direction.

The edge of the second wiring structure 220, for example, an edge of the second wiring insulating layer 226 might not be aligned with the edge of the second semiconductor substrate 200 in the vertical direction, and the edge of the second semiconductor substrate 200 may be positioned further inside than the edge of the second wiring insulating layer 226. The edges of the second wiring structure 220 and the second semiconductor substrate 200 might not be aligned with the edges of the upper semiconductor chip UC, the filling insulating layer 250, and the redistribution structure 400 in the vertical direction, and the edges of the second wiring structure 220 and the second semiconductor substrate 200 may be positioned further inside than the edges of the upper semiconductor chip UC, the filling insulating layer 250, and the redistribution structure 400.

In the semiconductor package 1, according to the inventive concept, a plurality of semiconductor chips including the upper semiconductor chip UC and the lower semiconductor chip LC may be stacked so as to cope with multi-functionality and large capacity, the lower semiconductor chip LC may be made relatively thin so as to cope with miniaturization, and the filling insulating layer 250 at least partially surrounding the lower semiconductor chip LC may be included, and thus, structural reliability may be obtained.

FIGS. 2A to 2H are cross-sectional views illustrating a method of manufacturing a semiconductor package, according to an embodiment of the inventive concept. In detail, FIGS. 2A to 2H are cross-sectional views illustrating a method of manufacturing the semiconductor package 1 shown in FIGS. 1A to 1C. In FIGS. 2A to 2H, the same reference numerals as those of FIGS. 1A to 1C may represent the same components, and to the extent that a detailed description of one or more elements is omitted, it may be assumed that those elements are at least similar to corresponding elements that have been described elsewhere within the specification.

Figure 2A:
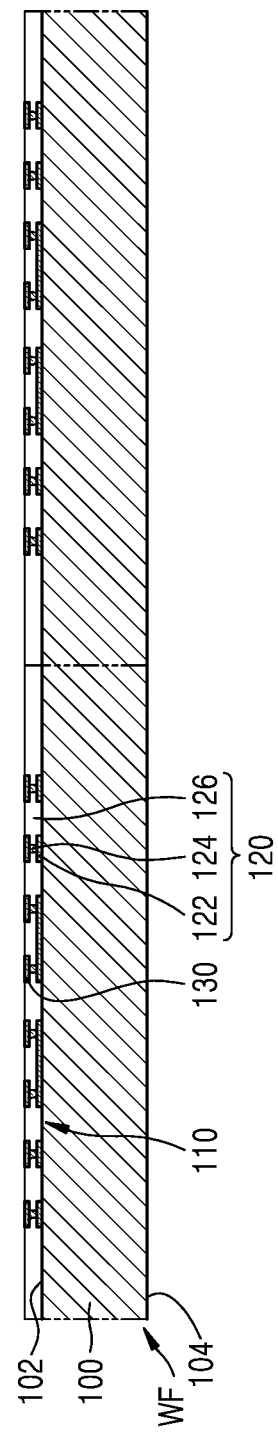
FIGS. 2A to 2H are cross-sectional views illustrating a method of manufacturing a semiconductor package, according to an embodiment of the inventive concept.

Referring to FIG. 2A, a wafer structure WF having the first semiconductor substrate 100 and the first wiring structure 120 may be prepared. The first semiconductor substrate 100 may have the first surface 102 that is an active surface and the second surface 104 that is an inactive surface opposite to the first surface 102. The first wiring structure 120 may be formed on the first surface 102 of the first semiconductor substrate 100.

The wafer structure WF may be attached on a carrier substrate with an adhesive film therebetween. The carrier substrate may be a semiconductor substrate, a glass substrate, a ceramic substrate, a plastic substrate, etc. The adhesive film may include a non-conductive film (NCF), an anisotropic conductive film (ACF), an instant adhesive, a thermosetting adhesive, a laser curing adhesive, an ultrasonic curing adhesive, a non-conductive paste (NCP), etc.

The wafer structure WF may include a plurality of first semiconductor devices 110, which are included in the upper semiconductor chip UC shown in FIGS. 1A to 1C, on the first surface 102 of the first semiconductor substrate 100. The wafer structure WF including the plurality of first semiconductor devices 110 may be separated through a sawing process in a subsequent process to form a plurality of upper semiconductor chips UC each having the first semiconductor device 110.

The wafer structure WF may include a plurality of first front surface connection pads 130. The plurality of first front surface connection pads 130 may be electrically connected to the first wiring layer 122 and the first via plug 124 of the first wiring structure 120. The plurality of first front surface connection pads 130 may include, for example, a material containing Cu. Side surfaces of the plurality of first front surface connection pads 130 may be at least partially surrounded by the first wiring insulating layer 126. For example, at least portions of the plurality of first front surface connection pads 130 may be buried in the first wiring insulating layer 126 of the first wiring structure 120, and upper surfaces of the plurality of first front surface connection pads 130 may be exposed without being covered by the first wiring insulating layer 126.

In some embodiments, the upper surfaces of the plurality of first front surface connection pads 130 may be coplanar with an upper surface of the first wiring insulating layer 126. In some embodiments, the upper surfaces of the plurality of first front surface connection pads 130 may convexly protrude with respect to the upper surface of the first wiring insulating layer 126. In some embodiments, the upper surfaces of the plurality of first front surface connection pads 130 may be concavely recessed with respect to the upper surface of the first wiring insulating layer 126.

Figure 2B:
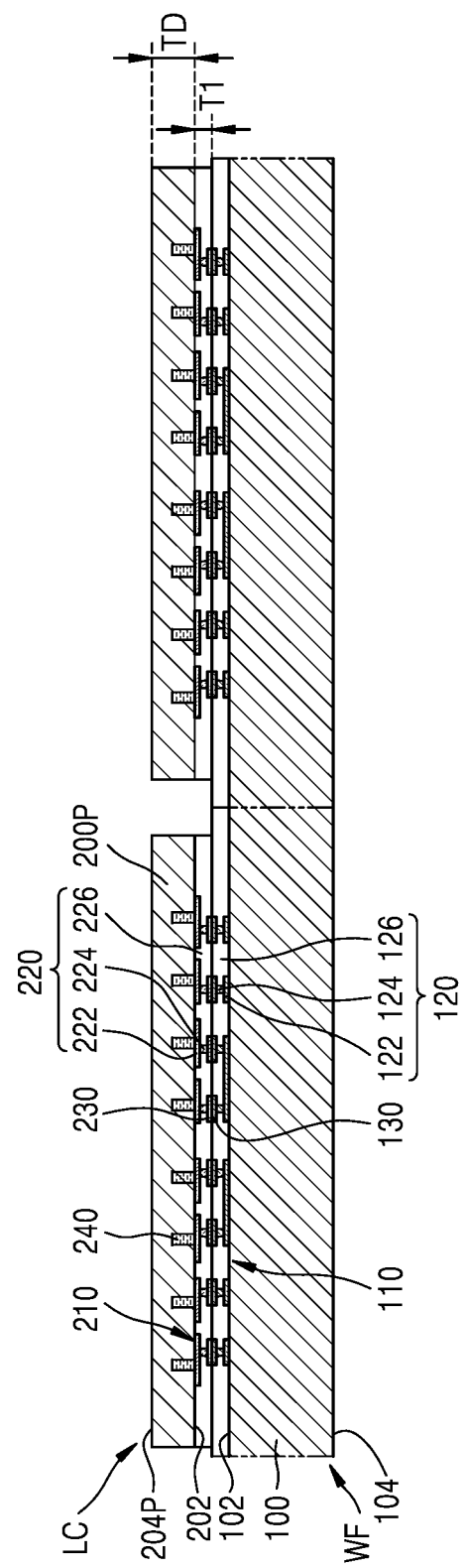

Referring to FIG. 2B, a plurality of lower semiconductor chips LC may be attached on the wafer structure WF. The plurality of lower semiconductor chips LC may be attached on the wafer structure WF to be spaced apart from each other in correspondence with the plurality of first semiconductor devices 110. Each of the plurality of lower semiconductor chips LC may have a preliminary semiconductor substrate 200P instead of the second semiconductor substrate 200 included in the plurality of lower semiconductor chips LC shown in FIGS. 1A to 1C. A portion of the preliminary semiconductor substrate 200P may be removed in a subsequent process to form the second semiconductor substrate 200 shown in FIGS. 1A to 1C. For example, the second semiconductor substrate 200 shown in FIGS. 1A to 1C may be a portion of the preliminary semiconductor substrate 200P. The preliminary semiconductor substrate 200P may have the third surface 202 that is an active surface and a fifth surface 204P that is an inactive surface opposite to the third surface 202.

The lower semiconductor chip LC may include the preliminary semiconductor substrate 200P and the second wiring structure 220 disposed on a lower surface of the preliminary semiconductor substrate 200P. An edge of the preliminary semiconductor substrate 200P may be aligned with the edge of the second wiring structure 220 in the vertical direction. The lower semiconductor chip LC may include the plurality of through electrodes 240 each having one end thereof connected to the second wiring layer 222 of the second wiring structure 220. The plurality of through electrodes 240 may be buried in the preliminary semiconductor substrate 200P.

The second wiring structure 220 may have the first thickness T1, and the preliminary semiconductor substrate 200P may have an initial thickness TD. The initial thickness TD may have a value that is greater than that of the second thickness T2 described with reference to FIGS. 1A to 1C. For example, the initial thickness TD may have a value of about 40 μm to about 80 μm. A horizontal width of the preliminary semiconductor substrate 200P may have a value that is greater than that of the horizontal width of the second semiconductor substrate 200 shown in FIGS. 1A to 1C. For example, the horizontal width of the preliminary semiconductor substrate 200P may have a value that is greater than that of the horizontal width of the second semiconductor substrate 200 shown in FIGS. 1A to 1C by twice the second width W2.

The lower semiconductor chip LC may further include a plurality of second front surface connection pads 230. The plurality of second front surface connection pads 230 may be electrically connected to the second wiring layer 222 and the second via plug 224 of the second wiring structure 220. The plurality of second front surface connection pads 230 may include, for example, a material containing Cu. Side surfaces of the plurality of second front surface connection pads 230 may be at least partially surrounded by the second wiring insulating layer 226. For example, at least portions of the plurality of second front surface connection pads 230 may be buried in the second wiring insulating layer 226 of the second wiring structure 220, and lower surfaces of the plurality of second front surface connection pads 230 may be exposed without being covered by the second wiring insulating layer 226.

In some embodiments, the lower surfaces of the plurality of second front surface connection pads 230 may be coplanar with a lower surface of the second wiring insulating layer 226. In some embodiments, the lower surfaces of the plurality of second front surface connection pads 230 may convexly protrude with respect to the lower surface of the second wiring insulating layer 226. In some embodiments, the lower surfaces of the plurality of second front surface connection pads 230 may be concavely recessed with respect to the lower surface of the second wiring insulating layer 226.

The plurality of lower semiconductor chips LC may be attached on the wafer structure WF such that the plurality of second front surface connection pads 230 and the plurality of first front surface connection pads 130 correspond to each other.

In some embodiments, before attaching the plurality of lower semiconductor chips LC on the wafer structure WF, deionized (DI) water may be coated on the wafer structure WF. Hydroxide (OH—) ions may be formed on the upper surface of the first wiring insulating layer 126 coated with the DI water. When the plurality of lower semiconductor chips LC are attached on the wafer structure WF coated with the DI water, the first wiring insulating layer 126 and the second wiring insulating layer 226 may be bonded to each other by the OH— ions. For example, the first wiring insulating layer 126 and the second wiring insulating layer 226 may be bonded to each other through a covalent bond.

In some embodiments, in the process of attaching the plurality of lower semiconductor chips LC on the wafer structure WF, heat and/or pressure may be applied so that the first wiring insulating layer 126 and the second wiring insulating layer 226 may be bonded to each other. For example, in the process of attaching the plurality of lower semiconductor chips LC on the wafer structure WF, heat of a first temperature may be applied.

Figure 2C:
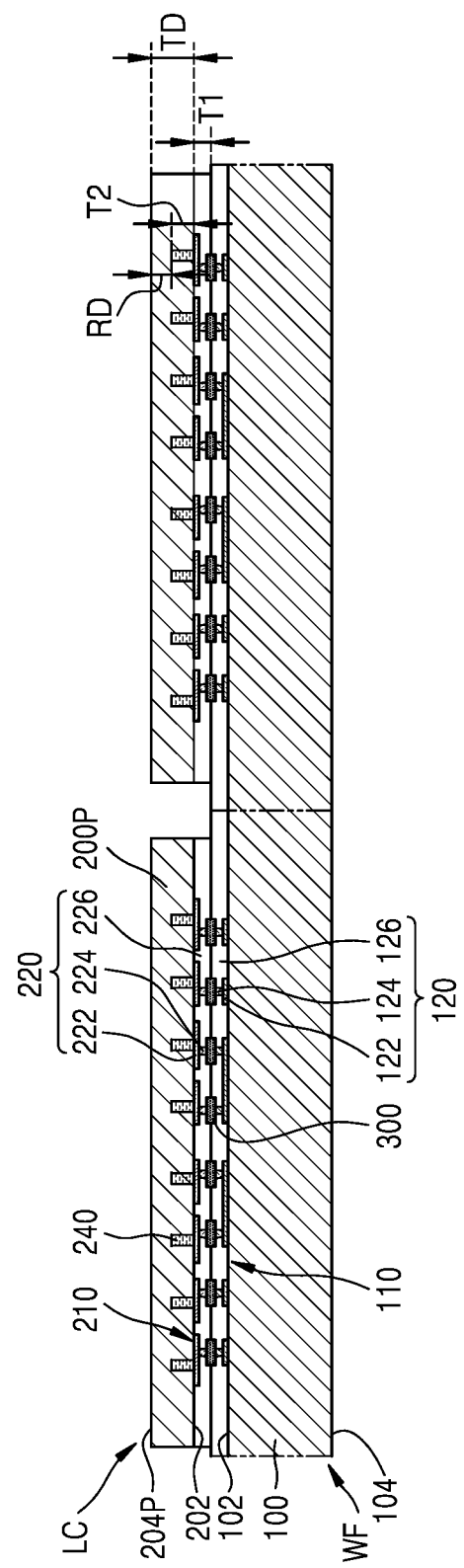

Referring to FIGS. 2B and 2C together, the plurality of first front surface connection pads 130 and the plurality of second front surface connection pads 230 corresponding to each other are bonded together form the plurality of bonding pads 300. The plurality of bonding pads 300 may be formed by a hybrid bonding process in which the plurality of first front surface connection pads 130 and the plurality of second front surface connection pads 230 corresponding to each other are bonded together. The plurality of bonding pads 300 may be formed by applying heat of a second temperature that is higher than the first temperature so that the plurality of first front surface connection pads 130 and the plurality of second front surface connection pads 230 corresponding to each other may be bonded together. The plurality of first front surface connection pads 130 and the plurality of second front surface connection pads 230 corresponding to each other may be expanded by heat to contact each other, and then may integrally form the plurality of bonding pads 300 by being diffusion-bonded through diffusion of metal atoms included therein.

The second via plug 224 may be connected to an upper surface of each of the plurality of bonding pads 300, and the first via plug 124 may be connected to a lower surface of each of the plurality of bonding pads 300. The plurality of bonding pads 300 may be at least partially surrounded by the first wiring insulating layer 126 and the second wiring insulating layer 226. For example, in a lower portion of each of the plurality of bonding pads 300, a remaining portion excluding a portion of the lower surface to which the first via plug 124 is connected may be at least partially surrounded by the first wiring insulating layer 126. Also, in an upper portion of each of the plurality of bonding pads 300, a remaining portion excluding a portion of the upper surface to which the second via plug 224 is connected may be at least partially surrounded by the second wiring insulating layer 226.

Figure 2D:
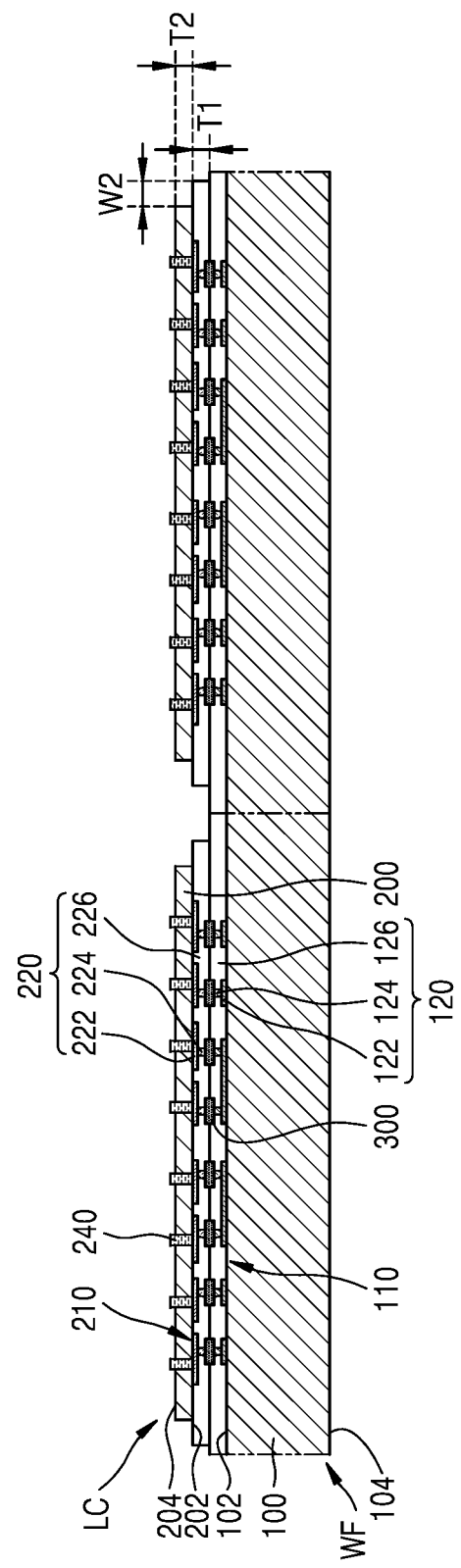

Referring to FIGS. 2C and 2D together, the second semiconductor substrate 200 may be formed by removing a portion of the preliminary semiconductor substrate 200P. The fourth surface 204, that is an inactive surface of the second semiconductor substrate 200, may be formed by removing a portion of the preliminary semiconductor substrate 200P. The second semiconductor substrate 200 may be formed by performing isotropic etching on the preliminary semiconductor substrate 200P. In some embodiments, the second semiconductor substrate 200 may be formed by performing an etching process using an etching gas capable of selectively removing the preliminary semiconductor substrate 200P. For example, the second semiconductor substrate 200 may be formed by performing an etching process using an etching gas capable of selectively removing Si.

In the process of forming the second semiconductor substrate 200 by removing a portion of the preliminary semiconductor substrate 200P, the second wiring structure 220 and the first wiring structure 120 might not be removed, and the first semiconductor substrate 100 might not be removed due to being covered by the first wiring structure 120.

By removing a portion of the preliminary semiconductor substrate 200P, the other end of each of the plurality of through electrodes 240 may protrude from the fourth surface 204 of the second semiconductor substrate 200 so as to be exposed.

The second semiconductor substrate 200 may have the second thickness T2 by removing a portion corresponding to a removal thickness RD from the fifth surface 204P of the preliminary semiconductor substrate 200P and removing a portion corresponding to the second width W2 from a side surface of the preliminary semiconductor substrate 200P. The second width W2 may be referred to as a removal width. For example, the horizontal width of the second semiconductor substrate 200 may have a value that is less than that of the horizontal width of the second wiring structure 220 by twice the second width W2. The second thickness T2 may have a value that is less than that of the second width W2. The removal thickness RD may have a value of about 15 μm to about 45 μm. The second thickness T2 may have a value of about 5 μm to about 15 μm. In some embodiments, the removal thickness RD and the second width W2 may have substantially the same value.

Figure 2E:
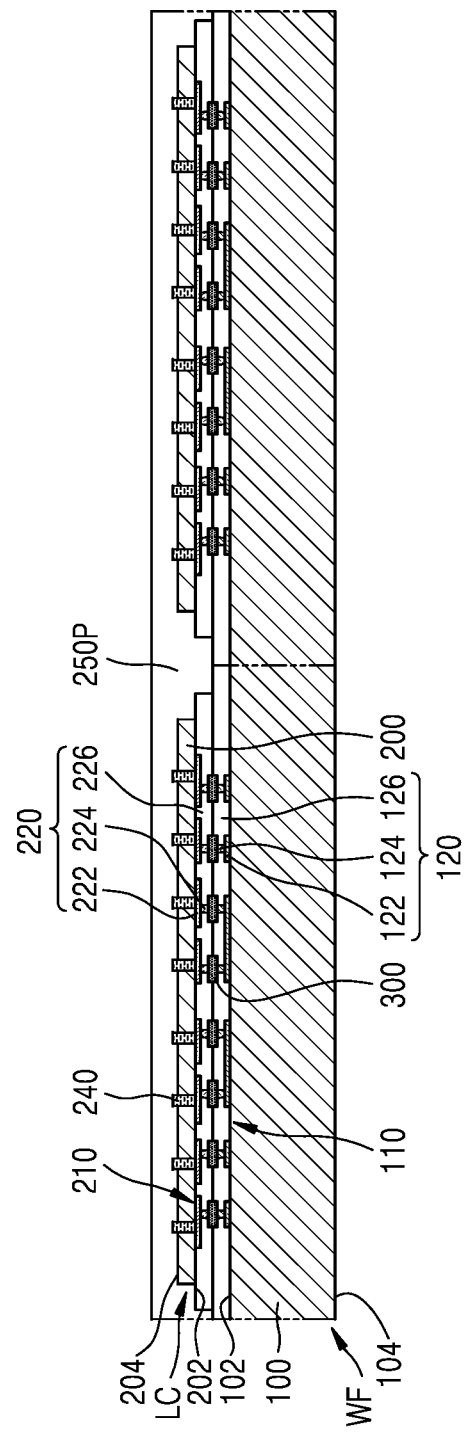

Referring to FIG. 2E, a preliminary filling insulating layer 250P covering the plurality of lower semiconductor chips LC may be formed on the wafer structure WF. The preliminary filling insulating layer 250P may fill a space between the plurality of lower semiconductor chips LC on the wafer structure WF, and may cover the plurality of lower semiconductor chips LC. The preliminary filling insulating layer 250P may have a thickness that is greater than that of the lower semiconductor chip LC, for example, the sum of the first thickness Ti and the second thickness T2. In some embodiments, the preliminary filling insulating layer 250P may be formed through a chemical vapor deposition (CVD) process.

In some embodiments, the preliminary filling insulating layer 250P may include a material different from that of at least a portion of each of the first wiring insulating layer 126 and the second wiring insulating layer 226. For example, the preliminary filling insulating layer 250P may include SiO, and at least a portion of each of the first wiring insulating layer 126 and the second wiring insulating layer 226 may include SiN, SiON, SiCN, SiOC, a polymer material, and/or an insulating material having a lower dielectric constant than SiO.

Figure 2F:
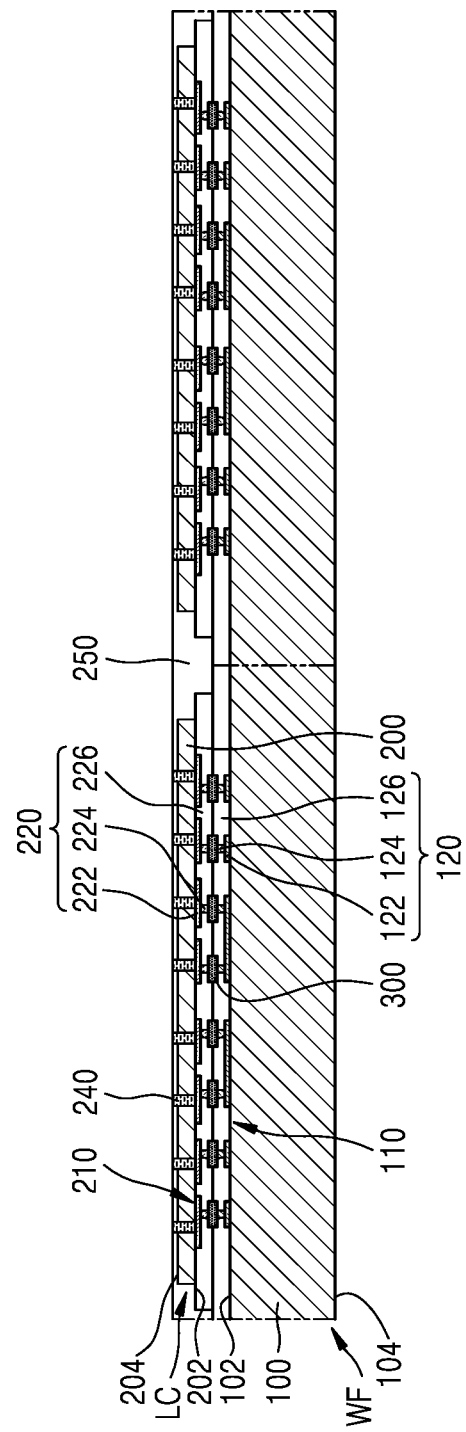

Referring to FIGS. 2E and 2F together, the filling insulating layer 250 is formed by removing a portion of the preliminary filling insulating layer 250P until the plurality of through electrodes 240 are exposed. The filling insulating layer 250 may be formed by removing an upper portion of the preliminary filling insulating layer 250P until the other ends of the plurality of through electrodes 240 are exposed.

In some embodiments, the filling insulating layer 250 may be formed by performing a chemical mechanical polishing (CMP) process to remove an upper portion of the preliminary filling insulating layer 250P. The upper surface of the filling insulating layer 250 and the other end of the through electrode 240 may be located at the same vertical level to be coplanar. The filling insulating layer 250 may cover the fourth surface 204 of the lower semiconductor chip LC, and may at least partially surround a portion of the through electrode 240 protruding from the fourth surface 204 of the second semiconductor substrate 200.

Figure 2G:
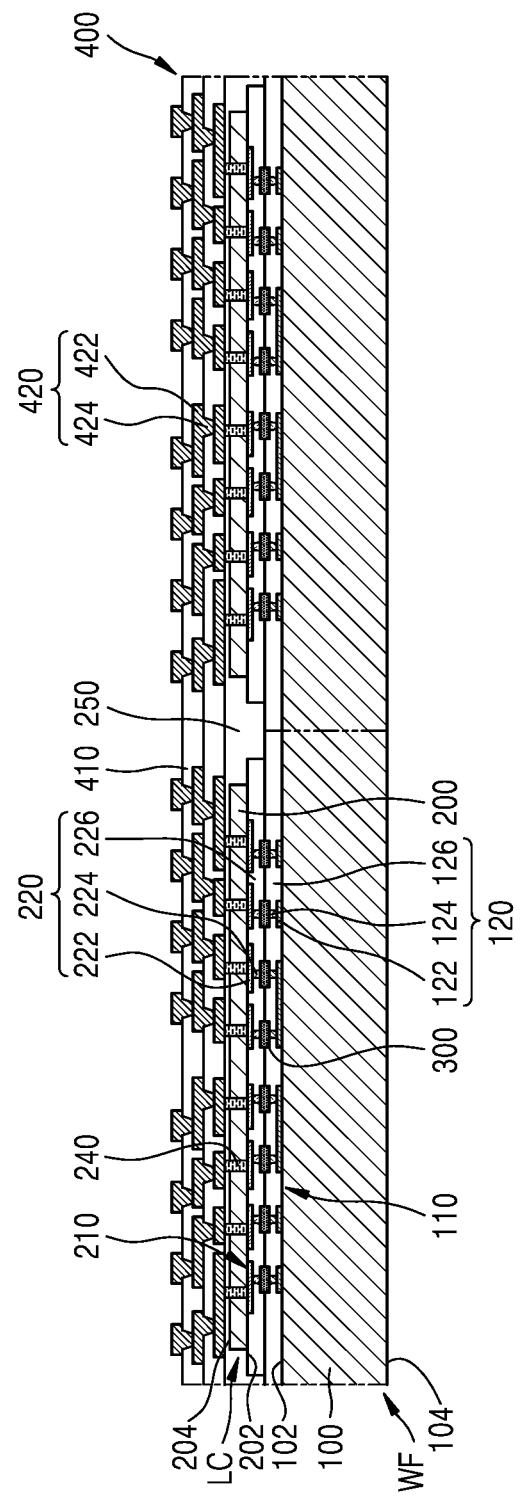

Referring to FIG. 2G, the redistribution structure 400 may be formed on the filling insulating layer 250. The redistribution structure 400 may include at least one redistribution insulating layer 410 and the plurality of redistribution patterns 420. The plurality of redistribution patterns 420 may include the plurality of redistribution line patterns 422 and the plurality of redistribution vias 424.

In some embodiments, the redistribution structure 400 may include the plurality of stacked redistribution insulating layers 410. For example, the redistribution structure 400 may be formed by repeatedly forming one of the plurality of redistribution insulating layers 410 and a portion of the plurality of redistribution patterns 420.

The plurality of redistribution line patterns 422 may be disposed on the upper and lower surfaces of the redistribution insulating layer 410, and/or the plurality of redistribution vias 424 may penetrate at least one redistribution insulating layer 410 to respectively contact some of the plurality of redistribution line patterns 422 and be connected thereto.

In some embodiments, the plurality of redistribution vias 424 may have a tapered shape in which a horizontal width of the redistribution via 424 decreases upwards. For example, the plurality of redistribution vias 424 may have horizontal widths increasing away from the lower semiconductor chip LC.

In some embodiments, at least some of the plurality of redistribution line patterns 422 may be integrally formed with some of the plurality of redistribution vias 424. For example, the redistribution via 424 may be integrally formed with the redistribution line pattern 422 contacting a surface having a large horizontal width from among upper and lower surfaces of the redistribution via 424. For example, the redistribution line pattern 422 and the redistribution via 424 contacting the lower surface of the redistribution line pattern 422 may be integrally formed.

From among the plurality of redistribution line patterns 422, a redistribution upper pad may be connected to the through electrode 240 of the lower semiconductor chip LC.

Figure 2H:
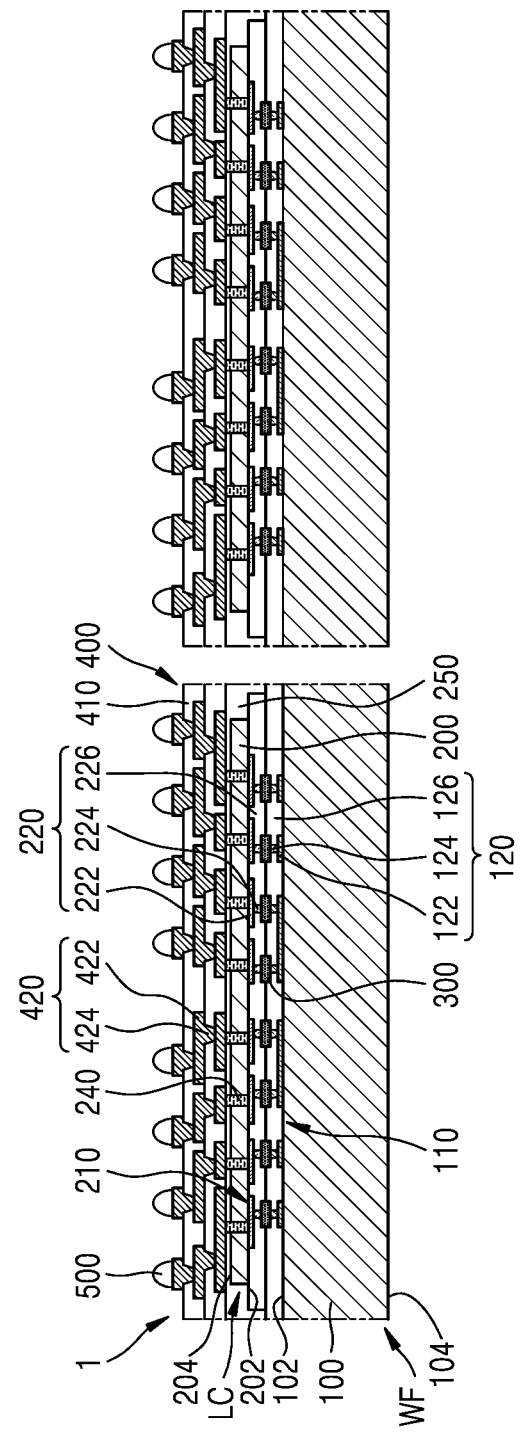

Referring to FIG. 2H, the external connection terminal 500 may be attached to a redistribution lower pad from among the plurality of redistribution line patterns 422. In some embodiments, the external connection terminal 500 may be formed as a bump, a solder ball, etc. Thereafter, in order to separate the wafer structure WF including the plurality of first semiconductor devices 110 into a plurality of upper semiconductor chips UC each having the first semiconductor device 110, a sawing process may be performed on the first semiconductor substrate 100 and the first wiring structure 120 included in the wafer structure WF, the filling insulating layer 250, and the redistribution structure 400, thereby forming a plurality of semiconductor packages 1.

In the method of manufacturing the semiconductor package 1, according to the inventive concept, a plurality of semiconductor chips including the upper semiconductor chip UC and the lower semiconductor chip LC may be stacked so as to cope with multifunctionality and large capacity, the lower semiconductor chip LC may be made relatively thin to cope with miniaturization, and the filling insulating layer 250 at least partially surrounding the lower semiconductor chip LC may be included, and thus, the semiconductor package 1 may have structural reliability.

Figure 3:
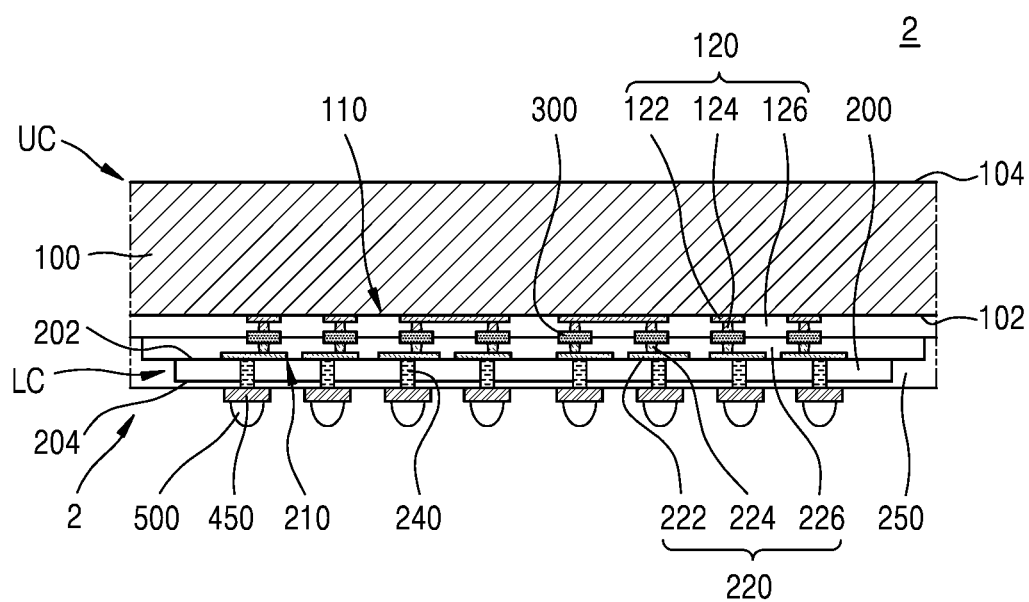
FIG. 3 is a cross-sectional view illustrating a semiconductor package according to an embodiment of the inventive concept.

FIG. 3 is a cross-sectional view of a semiconductor package 2 according to an embodiment of the inventive concept. In FIG. 3, the same reference numerals as those of FIGS. 1A to 1C may represent the same components, and to the extent that a detailed description of one or more elements is omitted, it may be assumed that those elements are at least similar to corresponding elements that have been described elsewhere within the specification.

Referring to FIG. 3, the semiconductor package 2 may include the lower semiconductor chip LC and the upper semiconductor chip UC stacked on the lower semiconductor chip LC. The semiconductor package 2 shown in FIG. 3 might not include the redistribution structure 400 included in the semiconductor package 1 shown in FIGS. 1A to 1C.

The upper semiconductor chip UC may include the first semiconductor substrate 100 and the first wiring structure 120 disposed on the first semiconductor substrate 100. The lower semiconductor chip LC may include the second semiconductor substrate 200 and the second wiring structure 220 disposed on the second semiconductor substrate 200.

For example, the first semiconductor device 110 may be disposed on the first surface 102 of the first semiconductor substrate 100, and the first wiring structure 120 may be disposed on the first surface 102 of the first semiconductor substrate 100. For example, the second semiconductor device 210 may be disposed on the third surface 202 of the second semiconductor substrate 200, and the second wiring structure 220 may be disposed on the third surface 202 of the first semiconductor substrate 200.

The first wiring structure 120 may include the plurality of first wiring layers 122, the plurality of first via plugs 124, and the first wiring insulating layer 126 at least partially surrounding the plurality of first wiring layers 122 and the plurality of first via plugs 124. The second wiring structure 220 may include the plurality of second wiring layers 222, the plurality of second via plugs 224, and the second wiring insulating layer 226 at least partially surrounding the plurality of second wiring layers 222 and the plurality of second via plugs 224.

The upper semiconductor chip UC may be stacked on the lower semiconductor chip LC such that the first active surface and the second active surface, for example, the first surface 102 and the third surface 202 face each other, and the first inactive surface and the second inactive surface, for example, the second surface 104 and the fourth surface 204 are opposite to each other. The upper semiconductor chip UC may be stacked on the lower semiconductor chip LC such that the first wiring structure 120 of the upper semiconductor chip UC and the second wiring structure 220 of the lower semiconductor chip LC face each other. The first wiring structure 120 and the second wiring structure 220 may contact each other.

The lower semiconductor chip LC may have the plurality of through electrodes 240 penetrating the second semiconductor substrate 200. The through electrode 240 may extend between the third surface 202 and the fourth surface 204 of the second semiconductor substrate 200. At least a portion of the through electrode 240 may have a pillar shape. In some embodiments, one end of the through electrode 240 may be connected to the second wiring layer 222 of the second wiring structure 220. The through electrode 240 may penetrate the second semiconductor substrate 200 from one end thereof to the other end thereof, so that the other end of the through electrode 240 may be exposed on the fourth surface 204 of the second semiconductor substrate 200. In some embodiments, the through electrode 240 may have a shape in which the other end thereof protrudes from the fourth surface 204 of the second semiconductor substrate 200.

The plurality of bonding pads 300 may be disposed between the upper semiconductor chip UC and the lower semiconductor chip LC. The plurality of bonding pads 300 may electrically connect the upper semiconductor chip UC to the lower semiconductor chip LC. The upper semiconductor chip UC may be electrically connected to the redistribution pattern 420 of the redistribution structure 400 through the bonding pad 300, the second wiring layer 222 and the second via plug 224 of the second wiring structure 220, and the through electrode 240.

The first via plug 124 may be connected to an upper surface of each of the plurality of bonding pads 300, and the second via plug 224 may be connected to a lower surface of each of the plurality of bonding pads 300. The plurality of bonding pads 300 may be at least partially surrounded by the first wiring insulating layer 126 and the second wiring insulating layer 226. For example, in an upper portion of each of the plurality of bonding pads 300, a remaining portion excluding a portion of the upper surface to which the first via plug 124 is connected may be at least partially surrounded by the first wiring insulating layer 126. Also, in a lower portion of each of the plurality of bonding pads 300, a remaining portion excluding a portion of the lower surface to which the second via plug 224 is connected may be at least partially surrounded by the second wiring insulating layer 226.

A horizontal width and a horizontal area of the lower semiconductor chip LC may have values that are less than those of a horizontal width and a horizontal area of the upper semiconductor chip UC. A horizontal width and a horizontal area of the second semiconductor substrate 200 of the lower semiconductor chip LC may have values that are less than those of a horizontal width and a horizontal area of the second wiring structure 220 of the lower semiconductor chip LC. An edge of the lower semiconductor chip LC may be an edge of the second wiring structure 220. Accordingly, the lower semiconductor chip LC may have a step shape having a step difference at a boundary between the second semiconductor substrate 200 and the second wiring structure 220.

The filling insulating layer 250 may at least partially surround the lower semiconductor chip LC and cover a lower surface of the lower semiconductor chip LC. The filling insulating layer 250 may at least partially surround a portion of the through electrode 240 protruding from the fourth surface 204 of the second semiconductor substrate 200. The lower semiconductor chip LC may be disposed between the filling insulating layer 250 and the upper semiconductor chip UC. In some embodiments, the filling insulating layer 250 may include a material different from that of at least a portion of each of the first wiring insulating layer 126 and the second wiring insulating layer 226.

An upper surface of the filling insulating layer 250 and an upper surface of the lower semiconductor chip LC, for example, an upper surface of the second wiring structure 220 may be located at the same vertical level to be coplanar, and a lower surface of the filling insulating layer 250 and the other end of the through electrode 240 may be located at the same vertical level so as to be coplanar.

In some embodiments, respective edges of the upper semiconductor chip UC and the filling insulating layer 250 may be aligned with each other in a vertical direction. For example, respective edges of the first semiconductor substrate 100, the first wiring insulating layer 126, and the filling insulating layer 250 may be aligned with each other in the vertical direction.

The edge of the second wiring structure 220, for example, an edge of the second wiring insulating layer 226 might not be aligned with the edge of the second semiconductor substrate 200 in the vertical direction, and the edge of the second semiconductor substrate 200 may be positioned further inside than the edge of the second wiring insulating layer 226. The edges of the second wiring structure 220 and the second semiconductor substrate 200 might not be aligned with the edges of the upper semiconductor chip UC and the filling insulating layer 250 in the vertical direction, and the edges of the second wiring structure 220 and the second semiconductor substrate 200 may be positioned further inside than the edges of the upper semiconductor chip UC and the filling insulating layer 250.

A plurality of external connection pads 450 may be disposed on the filling insulating layer 250 and the other ends of the plurality of through electrodes 240. The external connection pad 450 may function as the redistribution lower pad from among the plurality of redistribution line patterns 422 described with reference to FIG. 1A. The plurality of external connection pads 450 may include, for example, a metal such as Cu, Al, W, Ti, Ta, In, Mo, Mn, Co, Sn, Ni, Mg, Re, Be, Ga, or Ru, or an alloy thereof, but are not necessarily limited thereto. In some embodiments, the plurality of external connection pads 450 may be formed by stacking a metal or a metal alloy on a seed layer including Ti, TiN, or TiW.

The plurality of external connection terminals 500 may be attached to the plurality of external connection pads 450.

Figure 4A:
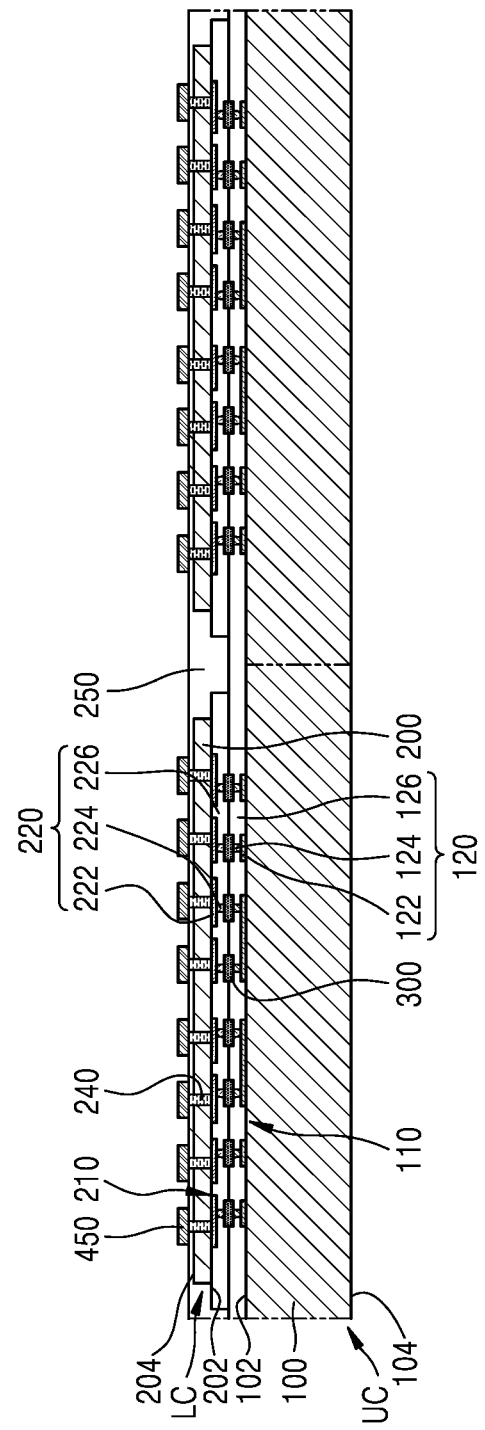
FIGS. 4A and 4B are cross-sectional views illustrating a method of manufacturing a semiconductor package, according to an embodiment of the inventive concept.
Figure 4B:
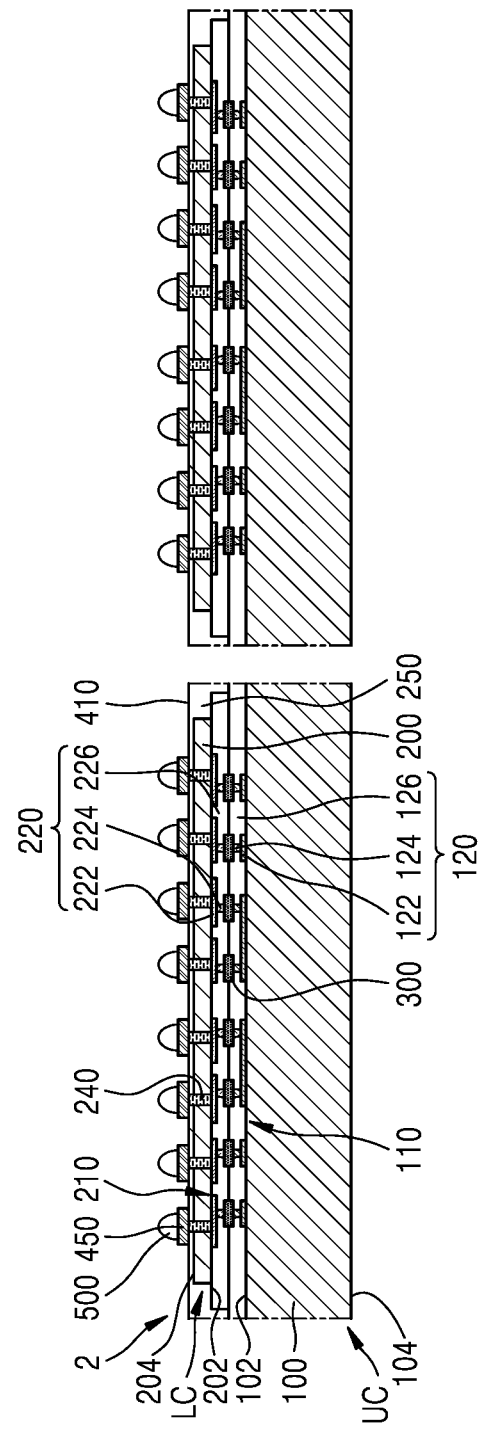

FIGS. 4A and 4B are cross-sectional views illustrating a method of manufacturing a semiconductor package, according to an embodiment of the inventive concept. In detail, FIGS. 4A and 4B are cross-sectional views illustrating a method of manufacturing the semiconductor package 2 shown in FIG. 3. In FIGS. 4A and 4B, the same reference numerals as those of FIGS. 3 and 2A to 2H may represent the same components, and to the extent that a detailed description of one or more elements is omitted, it may be assumed that those elements are at least similar to corresponding elements that have been described elsewhere within the specification.

Referring to FIG. 4A, on the result of FIG. 2F, the plurality of external connection pads 450 may be formed on the filling insulating layer 250 and the other ends of the plurality of through electrodes 240. The plurality of external connection pads 450 may be disposed on the plurality of through electrodes 240 corresponding thereto.

Referring to FIG. 4B, the plurality of external connection terminals 500 may be attached to the plurality of external connection pads 450. Thereafter, in order to separate the wafer structure WF including the plurality of first semiconductor devices 110 into a plurality of upper semiconductor chips UC each having the first semiconductor device 110, a sawing process may be performed on the first semiconductor substrate 100 and the first wiring structure 120 included in the wafer structure WF, and the filling insulating layer 250, thereby forming a plurality of semiconductor packages 2.

Figure 5:
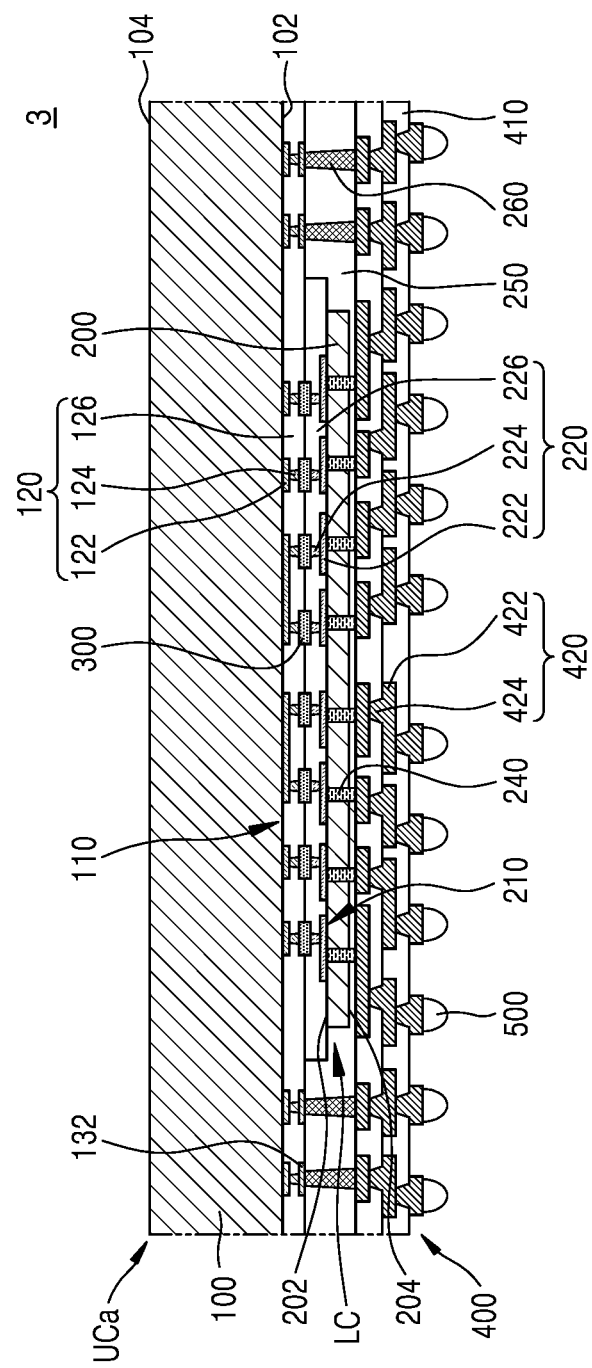
FIG. 5 is a cross-sectional view illustrating a semiconductor package according to an embodiment of the inventive concept.

FIG. 5 is a cross-sectional view of a semiconductor package 3 according to an embodiment of the inventive concept. In FIG. 5, the same reference numerals as those of FIGS. 1A to 1C may represent the same components, and to the extent that a detailed description of one or more elements is omitted, it may be assumed that those elements are at least similar to corresponding elements that have been described elsewhere within the specification.

Referring to FIG. 5, the semiconductor package 3 may include the redistribution structure 400, the lower semiconductor chip LC disposed on the redistribution structure 400, and an upper semiconductor chip UCa stacked on the lower semiconductor chip LC. The upper semiconductor chip UCa may be referred to as a first semiconductor chip, and the lower semiconductor chip LC may be referred to as a second semiconductor chip.

The upper semiconductor chip UCa may include the first semiconductor substrate 100 and the first wiring structure 120 disposed on the first semiconductor substrate 100. The lower semiconductor chip LC may include the second semiconductor substrate 200 and the second wiring structure 220 disposed on the second semiconductor substrate 200.

For example, the first semiconductor device 110 may be disposed on the first surface 102 of the first semiconductor substrate 100, and the first wiring structure 120 may be disposed on the first surface 102 of the first semiconductor substrate 100. For example, the second semiconductor device 210 may be disposed on the third surface 202 of the second semiconductor substrate 200, and the second wiring structure 220 may be disposed on the third surface 202 of the first semiconductor substrate 200.

The first wiring structure 120 may include the plurality of first wiring layers 122, the plurality of first via plugs 124, and the first wiring insulating layer 126 at least partially surrounding the plurality of first wiring layers 122 and the plurality of first via plugs 124. The second wiring structure 220 may include the plurality of second wiring layers 222, the plurality of second via plugs 224, and the second wiring insulating layer 226 at least partially surrounding the plurality of second wiring layers 222 and the plurality of second via plugs 224.

The upper semiconductor chip UCa may further include a plurality of via connection pads 132. The plurality via connection pads 132 may be electrically connected to the first wiring layer 122 and the first via plug 124 of the first wiring structure 120. The plurality of via connection pads 132 may include, for example, a material containing Cu. Side surfaces of the plurality of via connection pads 132 may be at least partially surrounded by the first wiring insulating layer 126. For example, at least portions of the plurality of via connection pads 132 may be buried in the first wiring insulating layer 126 of the first wiring structure 120, and upper surfaces of the plurality of via connection pads 132 may be exposed without being covered by the first wiring insulating layer 126. In some embodiments, the plurality of via connection pads 132 may be disposed outside the upper semiconductor chip UCa.

In some embodiments, the upper surfaces of the plurality of via connection pads 132 may be coplanar with an upper surface of the first wiring insulating layer 126. In some embodiments, the upper surfaces of the plurality of via connection pads 132 may convexly protrude with respect to the upper surface of the first wiring insulating layer 126. In some embodiments, the upper surfaces of the plurality of via connection pads 132 may be concavely recessed with respect to the upper surface of the first wiring insulating layer 126.

The upper semiconductor chip UCa may be stacked on the lower semiconductor chip LC such that the first active surface and the second active surface, for example, the first surface 102 and the third surface 202 face each other, and the first inactive surface and the second inactive surface, for example, the second surface 104 and the fourth surface 204 are opposite to each other. The upper semiconductor chip UCa may be stacked on the lower semiconductor chip LC such that the first wiring structure 120 of the upper semiconductor chip UCa and the second wiring structure 220 of the lower semiconductor chip LC face each other. The first wiring structure 120 and the second wiring structure 220 may contact each other. For example, the first wiring insulating layer 126 of the first wiring structure 120 and the second wiring insulating layer 226 of the second wiring structure 220 may directly contact each other.

The lower semiconductor chip LC may have the plurality of through electrodes 240 penetrating the second semiconductor substrate 200. The through electrode 240 may extend between the third surface 202 and the fourth surface 204 of the second semiconductor substrate 200. At least a portion of the through electrode 240 may have a pillar shape. In some embodiments, one end of the through electrode 240 may be connected to the second wiring layer 222 of the second wiring structure 220. The through electrode 240 may penetrate the second semiconductor substrate 200 from one end thereof to the other end thereof, such that the other end of the through electrode 240 may be exposed on the fourth surface 204 of the second semiconductor substrate 200. In some embodiments, the through electrode 240 may have a shape in which the other end thereof protrudes from the fourth surface 204 of the second semiconductor substrate 200.

The plurality of bonding pads 300 may be disposed between the upper semiconductor chip UCa and the lower semiconductor chip LC. The plurality of bonding pads 300 may electrically connect the upper semiconductor chip UCa to the lower semiconductor chip LC. The upper semiconductor chip UCa may be electrically connected to the redistribution pattern 420 of the redistribution structure 400 through the bonding pad 300, the second wiring layer 222 and the second via plug 224 of the second wiring structure 220, and the through electrode 240.

The first via plug 124 may be connected to an upper surface of each of the plurality of bonding pads 300, and the second via plug 224 may be connected to a lower surface of each of the plurality of bonding pads 300. The plurality of bonding pads 300 may be at least partially surrounded by the first wiring insulating layer 126 and the second wiring insulating layer 226. For example, in an upper portion of each of the plurality of bonding pads 300, a remaining portion excluding a portion of the upper surface to which the first via plug 124 is connected may be at least partially surrounded by the first wiring insulating layer 126. Also, in a lower portion of each of the plurality of bonding pads 300, a remaining portion excluding a portion of the lower surface to which the second via plug 224 is connected may be at least partially surrounded by the second wiring insulating layer 226.

The redistribution structure 400 may include at least one redistribution insulating layer 410 and the plurality of redistribution patterns 420. The plurality of redistribution patterns 420 may include the plurality of redistribution line patterns 422 and the plurality of redistribution vias 424. In some embodiments, the redistribution structure 400 may include a plurality of stacked redistribution insulating layers 410.

The plurality of redistribution line patterns 422 may be disposed on upper and/or lower surfaces of the redistribution insulating layer 410. The plurality of redistribution vias 424 may penetrate at least one redistribution insulating layer 410 to respectively contact some of the plurality of redistribution line patterns 422 and be connected thereto.

Some of the plurality of redistribution line patterns 422 disposed on an upper surface of the redistribution structure 400 may be referred to as redistribution upper pads, and some of plurality of the redistribution line patterns 422 disposed on a lower surface of the redistribution structure 400 may be referred to as redistribution lower pads. The through electrode 240 of the lower semiconductor chip LC may be connected to the redistribution upper pad, and the external connection terminal 500 may be attached to the redistribution lower surface pad. The external connection terminal 500 may electrically connect the semiconductor package 3 to the outside. In some embodiments, the external connection terminal 500 may be a bump, a solder ball, etc.

A horizontal width and a horizontal area of the lower semiconductor chip LC may have values that are less than those of a horizontal width and a horizontal area of the upper semiconductor chip UCa. A horizontal width and a horizontal area of the second semiconductor substrate 200 of the lower semiconductor chip LC may have values that are less than those of a horizontal width and a horizontal area of the second wiring structure 220 of the lower semiconductor chip LC. An edge of the lower semiconductor chip LC may be an edge of the second wiring structure 220. Accordingly, the lower semiconductor chip LC may have a step shape having a step difference at a boundary between the second semiconductor substrate 200 and the second wiring structure 220.

The filling insulating layer 250 may be disposed between the upper semiconductor chip UC and the redistribution structure 400, and may at least partially surround the lower semiconductor chip LCa. In some embodiments, the filling insulating layer 250 may be further disposed between the lower semiconductor chip LC and the redistribution structure 400 to at least partially surround a portion of the through electrode 240 protruding from the fourth surface 204 of the second semiconductor substrate 200.

The semiconductor package 3 may further include a plurality of through vias 260 penetrating the filling insulating layer 250 to connect the via connection pad 132 to the redistribution upper pad, respectively. The plurality of through vias 260 may electrically connect the upper semiconductor chip UCa to the redistribution structure 400. The plurality of through vias 260 may be disposed around the lower semiconductor chip LC. In some embodiments, the plurality of through vias 260 may include a metal material such as Cu, W, Ti, or Ta, or a nitride thereof. In some embodiments, the plurality of through vias 260 may have a tapered shape in which a horizontal width of the through via 260 decreases upwards and extends. For example, the plurality of through vias 260 may have horizontal widths increasing away from the upper semiconductor chip UCa.

In the semiconductor package 1 shown in FIGS. 1A to 1C and the semiconductor package 2 shown in FIG. 3, the upper semiconductor chip UC may be electrically connected to the redistribution structure 400 exclusively through the plurality of through electrodes 240 of the lower semiconductor chip LC. However, in the semiconductor package 3 shown in FIG. 5, the upper semiconductor chip UCa may be electrically connected to the redistribution structure 400 through the plurality of through electrodes 240 of the lower semiconductor chip LC and the plurality of through vias 260. In some embodiments, the upper semiconductor chip UCa may receive power/ground from the redistribution structure 400 through the plurality of through vias 260, and may transmit and receive a data signal or a control signal to and from the redistribution structure 400 through the plurality of through electrodes 240 of the lower semiconductor chip LC.

An upper surface of the filling insulating layer 250 and an upper surface of the lower semiconductor chip LC, for example, an upper surface of the second wiring structure 220 may be located at the same vertical level to be coplanar, and a lower surface of the filling insulating layer 250 and the other end of the through electrode 240 may be located at the same vertical level to be coplanar.

In some embodiments, respective edges of the upper semiconductor chip UCa, the filling insulating layer 250, and the redistribution structure 400 may be aligned with each other in a vertical direction. For example, respective edges of the first semiconductor substrate 100, the first wiring insulating layer 126, the filling insulating layer 250, and the redistribution insulating layer 410 may be aligned with each other in the vertical direction.

The edge of the second wiring structure 220, for example, an edge of the second wiring insulating layer 226 might not be aligned with the edge of the second semiconductor substrate 200 in the vertical direction, and the edge of the second semiconductor substrate 200 may be positioned further inside than the edge of the second wiring insulating layer 226. The edges of the second wiring structure 220 and the second semiconductor substrate 200 might not be aligned with the edges of the upper semiconductor chip UCa, the filling insulating layer 250, and the redistribution structure 400 in the vertical direction, and the edges of the second wiring structure 220 and the second semiconductor substrate 200 may be positioned further inside than the edges of the upper semiconductor chip UCa, the filling insulating layer 250, and the redistribution structure 400.

FIGS. 6A to 6I are cross-sectional views illustrating a method of manufacturing a semiconductor package, according to an embodiment of the inventive concept. In detail, FIGS. 6A to 6I are cross-sectional views illustrating a method of manufacturing the semiconductor package 3 shown in FIG. 5. In FIGS. 6A to 6I, the same reference numerals as those of FIGS. 5 and 2A to 2H may represent the same components, and to the extent that a detailed description of one or more elements is omitted, it may be assumed that those elements are at least similar to corresponding elements that have been described elsewhere within the specification.

Figure 6A:
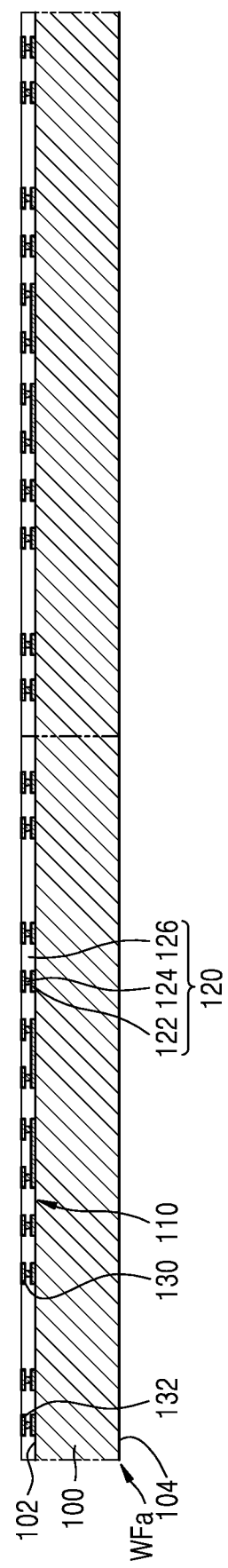
FIGS. 6A to 6I are cross-sectional views illustrating a method of manufacturing a semiconductor package, according to an embodiment of the inventive concept.

Referring to FIG. 6A, a wafer structure WFa having the first semiconductor substrate 100 and the first wiring structure 120 may be prepared. The wafer structure WFa may include the plurality of first semiconductor devices 110, which are included in the upper semiconductor chip UCa shown in FIG. 5, in the first semiconductor substrate 100. The wafer structure WFa including the plurality of first semiconductor devices 110 may be separated through a sawing process in a subsequent process to form a plurality of upper semiconductor chips UCa each having the first semiconductor device 110.

The wafer structure WFa may include the plurality of first front surface connection pads 130 and the plurality of via connection pads 132. The plurality of first front surface connection pads 130 and the plurality of via connection pads 132 may be electrically connected to the first wiring layer 122 and the first via plug 124 of the first wiring structure 120.

In some embodiments, the plurality of first front surface connection pads 130 and the plurality of via connection pads 132 may be formed together to have the same thickness and include the same material. In FIG. 6A, the plurality of first front surface connection pads 130 and the plurality of via connection pads 132 are illustrated as having the same horizontal width, but are not necessarily limited thereto. In some embodiments, the plurality of first front surface connection pads 130 and the plurality of via connection pads 132 may have different horizontal widths. For example, the horizontal widths of the plurality of via connection pads 132 may have values greater than those of the horizontal widths of the plurality of first front surface connection pads 130.

Figure 6B:
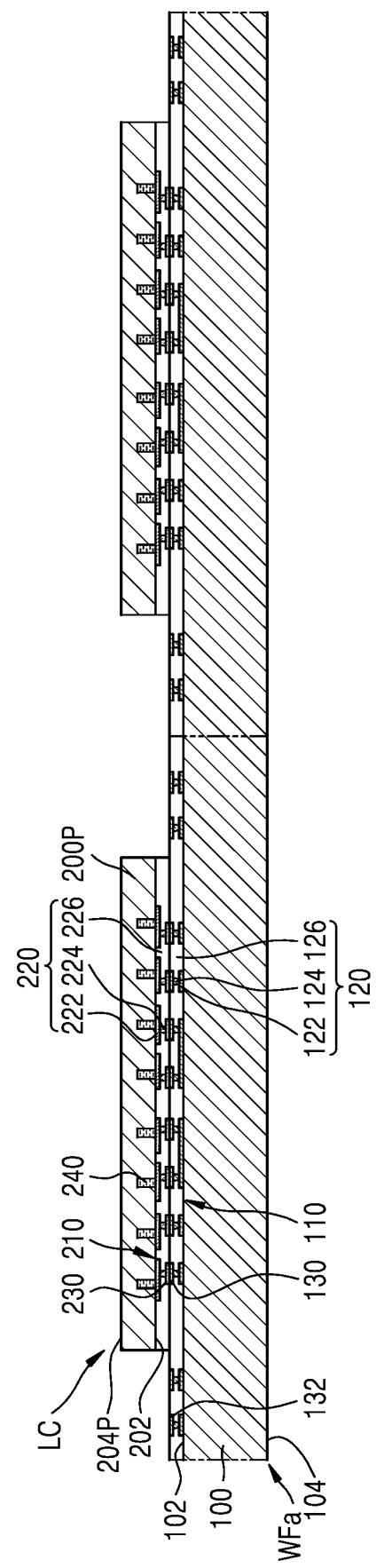

Referring to FIG. 6B, the plurality of lower semiconductor chips LC may be attached on the wafer structure WFa. The plurality of lower semiconductor chips LC may be attached on the wafer structure WFa to be spaced apart from each other in correspondence with the plurality of first semiconductor devices 110. Each of the plurality of lower semiconductor chips LC may have the preliminary semiconductor substrate 200P instead of the second semiconductor substrate 200 included in the plurality of lower semiconductor chips LC shown in FIG. 5.

The lower semiconductor chip LC may include the preliminary semiconductor substrate 200P, the second wiring structure 220 attached to a lower surface of the preliminary semiconductor substrate 200P, the plurality of through electrodes 240 each having one end thereof connected to the second wiring layer 222 of the second wiring structure 220 and being buried in the preliminary semiconductor substrate 200P, and the plurality of second front surface connection pads 230 electrically connected to the second via plug 224.

The plurality of lower semiconductor chips LC may be attached on the wafer structure WFa such that the plurality of second front surface connection pads 230 and the plurality of first front surface connection pads 130 correspond to each other. The plurality of lower semiconductor chips LC may be attached to the wafer structure WFa so as not to cover the plurality of via connection pads 132.

Figure 6C:
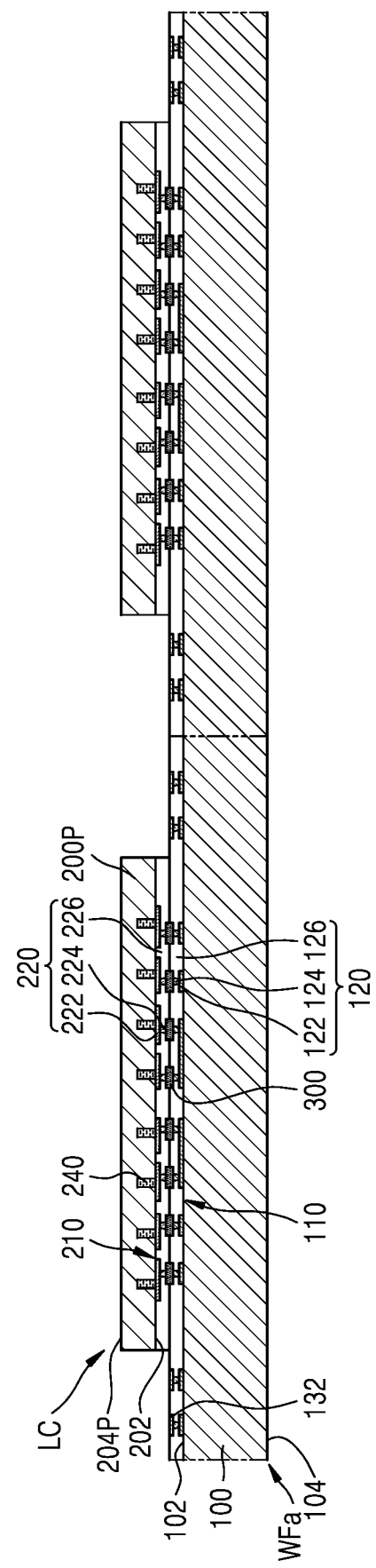

Referring to FIGS. 6B and 6C together, the plurality of first front surface connection pads 130 and the plurality of second front surface connection pads 230 corresponding to each other may be bonded together to form the plurality of bonding pads 300.

The second via plug 224 may be connected to an upper surface of each of the plurality of bonding pads 300, and the first via plug 124 may be connected to a lower surface of each of the plurality of bonding pads 300. The plurality of bonding pads 300 may be at least partially surrounded by the first wiring insulating layer 126 and the second wiring insulating layer 226. For example, in a lower portion of each of the plurality of bonding pads 300, a remaining portion excluding a portion of the lower surface to which the first via plug 124 is connected may be at least partially surrounded by the first wiring insulating layer 126. Also, in an upper portion of each of the plurality of bonding pads 300, a remaining portion excluding a portion of the upper surface to which the second via plug 224 is connected may be at least partially surrounded by the second wiring insulating layer 226.

Figure 6D:
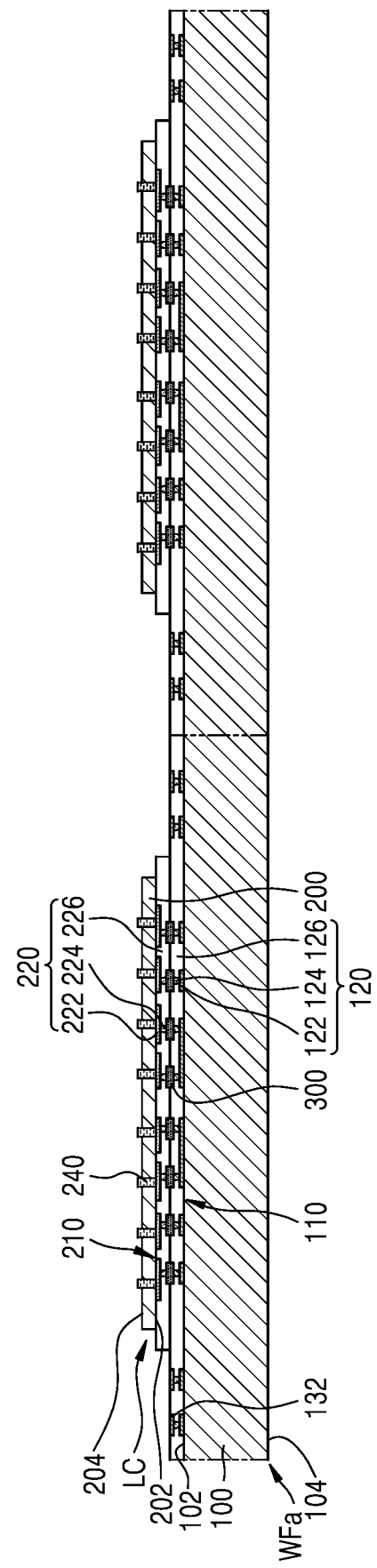

Referring to FIGS. 6C and 6D together, the second semiconductor substrate 200 may be formed by removing a portion of the preliminary semiconductor substrate 200P. The fourth surface 204 that is an inactive surface of the second semiconductor substrate 200 may be formed by removing a portion of the preliminary semiconductor substrate 200P. By removing a portion of the preliminary semiconductor substrate 200P, the other end of each of the plurality of through electrodes 240 may protrude from the fourth surface 204 of the second semiconductor substrate 200 to be exposed.

Figure 6E:
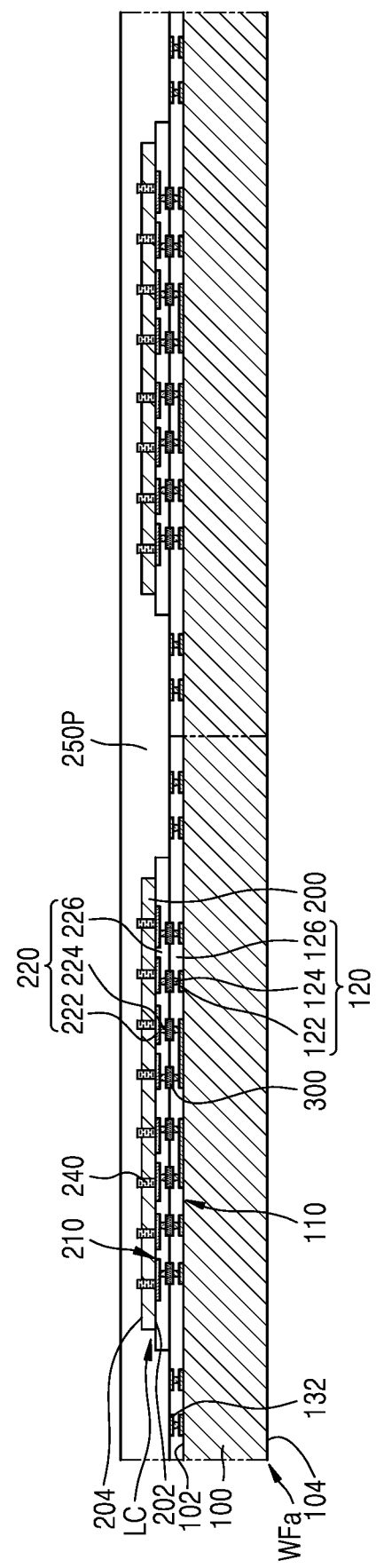

Referring to FIG. 6E, the preliminary filling insulating layer 250P covering the plurality of lower semiconductor chips LC may be formed on the wafer structure WFa. The preliminary filling insulating layer 250P may fill a space between the plurality of lower semiconductor chips LC on the wafer structure WFa, and may cover the plurality of lower semiconductor chips LC. The preliminary filling insulating layer 250P may cover the plurality of via connection pads 132 not to be exposed.

Figure 6F:
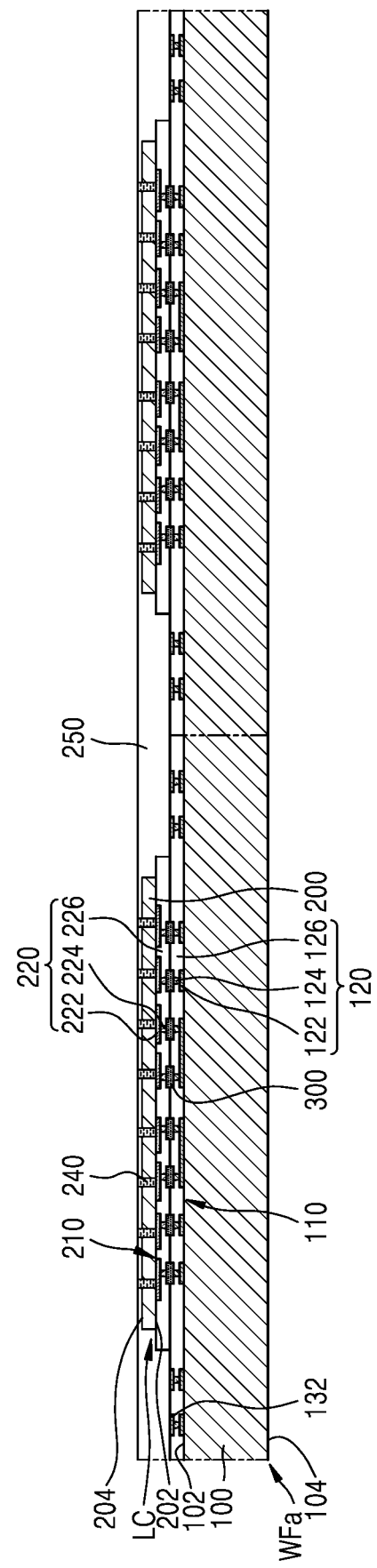

Referring to FIGS. 6E and 6F together, the filling insulating layer 250 may be formed by removing a portion of the preliminary filling insulating layer 250P until the plurality of through electrodes 240 are exposed. The filling insulating layer 250 may cover the fourth surface 204 of the second semiconductor substrate 200, and may at least partially surround a portion of the through electrode 240 protruding from the fourth surface 204 of the second semiconductor substrate 200.

Figure 6G:
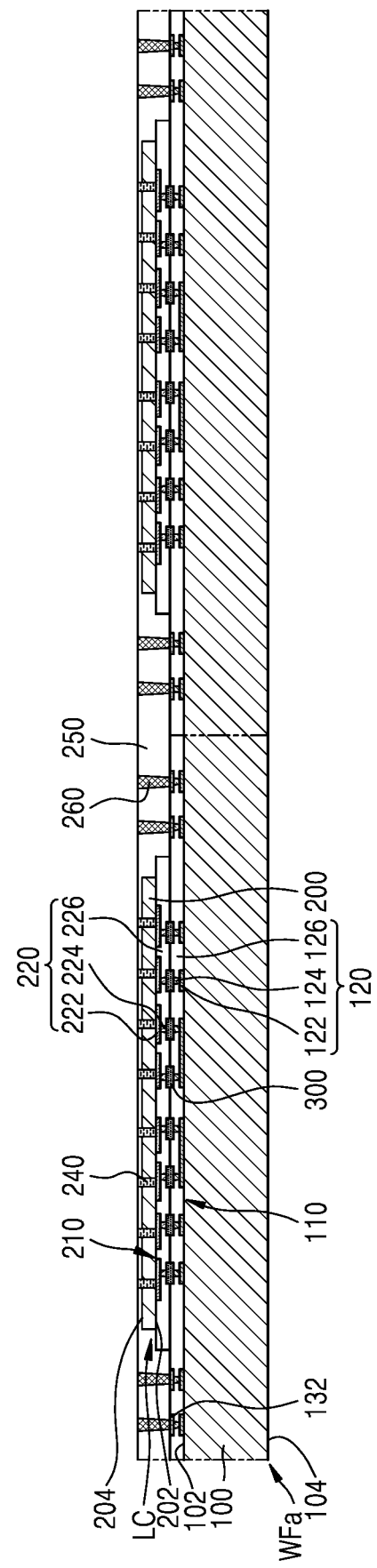

Referring to FIG. 6G, after forming a plurality of via holes penetrating the filling insulating layer 250 to expose the plurality of via connection pads 132 on a bottom surface, the plurality of through vias 260 filling the plurality of via holes may be formed. The plurality of through vias 260 may fill the plurality of via holes, and may be formed by forming a conductive material layer covering the filling insulating layer 250, and then removing a portion of the conductive material layer until the filling insulating layer 250 is exposed. The plurality of through vias 260 may penetrate the filling insulating layer 250 from ends thereof, which are connected to the plurality of via connection pads 132, to the other ends thereof, and the other ends of the plurality of through vias 260 may be exposed on the upper surface of the filling insulating layer 250. In some embodiments, the other ends of the plurality of through vias 260 and the upper surface of the filling insulating layer 250 may be located at the same vertical level to be coplanar.

Figure 6H:
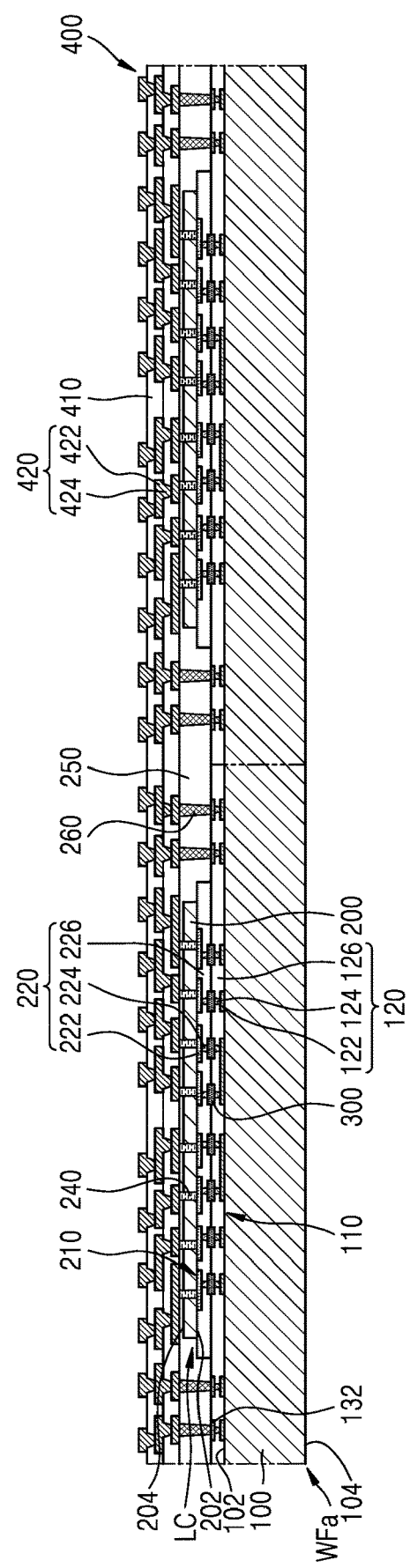

Referring to FIG. 6H, the redistribution structure 400 may be formed on the filling insulating layer 250 and the plurality of through vias 260. The redistribution structure 400 may include at least one redistribution insulating layer 410 and the plurality of redistribution patterns 420. The plurality of redistribution patterns 420 may include the plurality of redistribution line patterns 422 and the plurality of redistribution vias 424.

From among the plurality of redistribution line patterns 422, some of the redistribution upper pads may be connected to the plurality of through electrodes 240 of the lower semiconductor chip LC, and some others of the redistribution upper pads may be connected to the plurality of through vias 260.

Figure 6I:
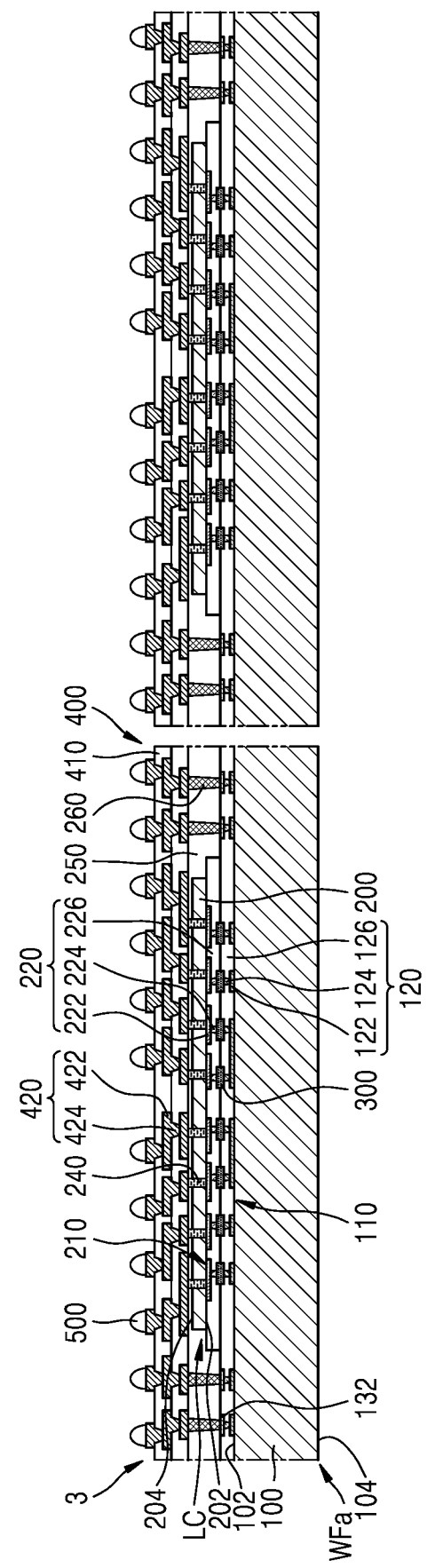

Referring to FIG. 6I, the external connection terminal 500 may be attached to the redistribution lower pad from among the plurality of redistribution line patterns 422. Thereafter, in order to separate the wafer structure WFa including the plurality of first semiconductor devices 110 into a plurality of upper semiconductor chips UCa each having the first semiconductor device 110, a sawing process may be performed on the first semiconductor substrate 100 and the first wiring structure 120 included in the wafer structure WFa, the filling insulating layer 250, and the redistribution structure 400, thereby forming a plurality of semiconductor packages 3.

Figure 7A:
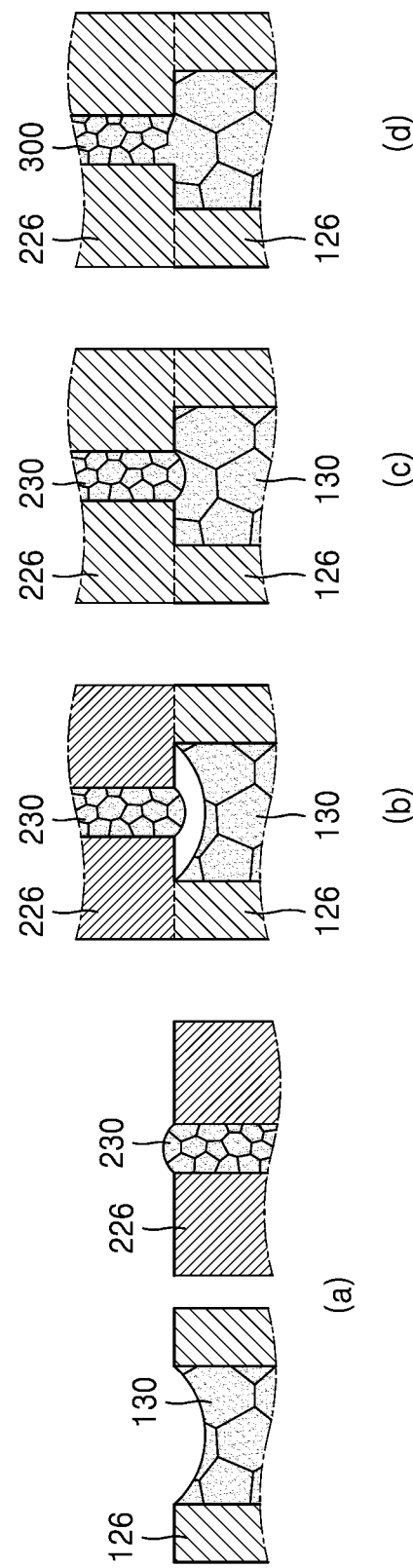
FIGS. 7A to 7C are cross-sectional views conceptually illustrating a process of forming a bonding pad in a method of manufacturing a semiconductor package, according to an embodiment of the inventive concept.
Figure 7B:
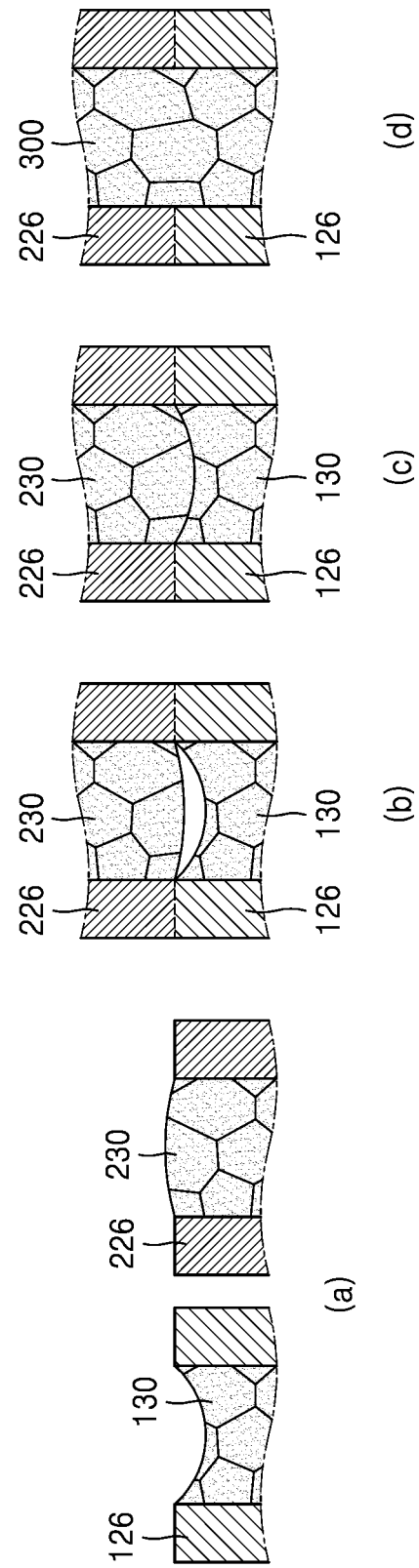
Figure 7C:
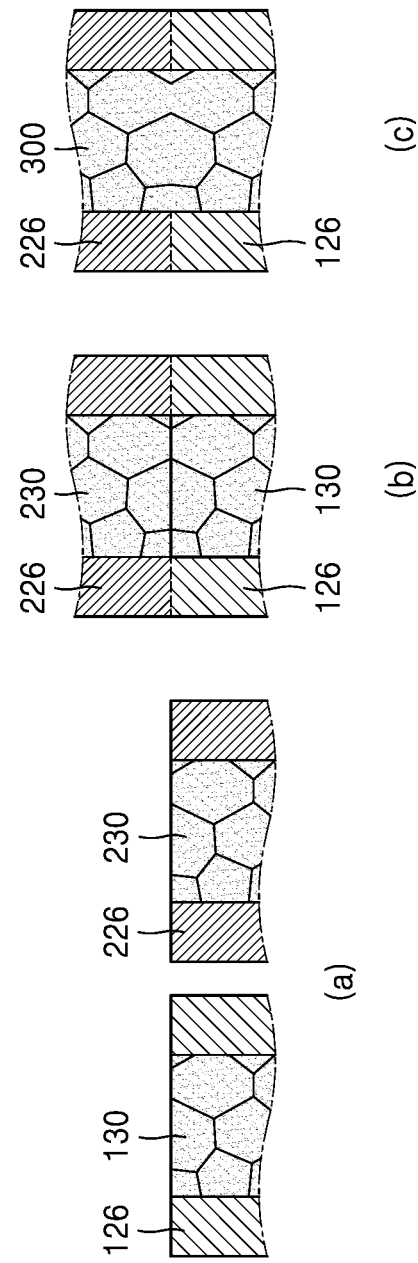

FIGS. 7A to 7C are cross-sectional views conceptually illustrating a process of forming the bonding pad 300 in a method of manufacturing a semiconductor package, according to an embodiment of the inventive concept, and descriptions on the process of forming the bonding pad 300 are given with reference to FIGS. 2B, 2C, 6B, and 6C.

Referring to FIG. 7A, as shown in (a), the first front surface connection pad 130 and the second front surface connection pad 230 may have different horizontal widths, and by adjusting conditions of a planarization process for forming the first front surface connection pad 130 and the second front surface connection pad 230, an upper surface of one of the first front surface connection pad 130 and the second front surface connection pad 230 may protrude convexly, and an upper surface of the other may be concavely recessed. In some embodiments, a horizontal width of the second front surface connection pad 230 may have a value that is less than that of a horizontal width of the first front surface connection pad 130.

When heat of a first temperature is applied, as shown in (b), the first wiring insulating layer 126 and the second wiring insulating layer 226 may contact each other. In some embodiments, the first wiring insulating layer 126 and the second wiring insulating layer 226 may be bonded to each other through a covalent bond. When heat of a second temperature is applied, as shown in (c), each of the first front surface connection pad 130 and the second front surface connection pad 230 may expand to contact each other, and then, as shown in (d), metal atoms included in each of the first front surface connection pad 130 and the second front surface connection pad 230 may be diffused to integrally form the bonding pad 300.

Referring to FIG. 7B, as shown in (a), the first front surface connection pad 130 and the second front surface connection pad 230 may have the same horizontal width, and by adjusting conditions of a planarization process for forming the first front surface connection pad 130 and the second front surface connection pad 230, an upper surface of one of the first front surface connection pad 130 and the second front surface connection pad 230 may protrude convexly, and an upper surface of the other may be concavely recessed. When heat of the first temperature is applied, as shown in (b), the first wiring insulating layer 126 and the second wiring insulating layer 226 may contact each other. In some embodiments, the first wiring insulating layer 126 and the second wiring insulating layer 226 may be bonded to each other through a covalent bond. When heat of the second temperature is applied, as shown in (c), each of the first front surface connection pad 130 and the second front surface connection pad 230 may expand to contact each other, and then, as shown in (d), metal atoms included in each of the first front surface connection pad 130 and the second front surface connection pad 230 may be diffused to integrally form the plurality of bonding pads 300.

Referring to FIG. 7C, as shown in (a), an upper surface of each of the first front surface connection pad 130 and the second front surface connection pad 230 may be coplanar with the upper surfaces of the first wiring insulating layer 126 and the second wiring insulating layer 226. In some embodiments, the first front surface connection pad 130 and the second front surface connection pad 230 may have the same horizontal width. In some embodiments, the first front surface connection pad 130 and the second front surface connection pad 230 may have different horizontal widths. When heat of the first temperature is applied, as shown in (b), the first wiring insulating layer 126 and the second wiring insulating layer 226 may contact each other. In some embodiments, the first wiring insulating layer 126 and the second wiring insulating layer 226 may be bonded to each other through a covalent bond. When heat of the second temperature is applied, as shown in (c), metal atoms included in each of the first front surface connection pad 130 and the second front surface connection pad 230 may be diffused to integrally form the plurality of bonding pads 300.

While the inventive concept has been particularly shown and described with reference to embodiments thereof, it will be understood that various changes in form and details may be made therein without departing from the spirit and scope of the present disclosure.

What is claimed is:

1. A method of manufacturing a semiconductor package, the method comprising:
    preparing a wafer structure having a first semiconductor substrate, a first wiring structure disposed on the first semiconductor substrate, and a plurality of first front surface connection pads of which at least a portion is buried in the first wiring structure;
    attaching, on the wafer structure, a lower semiconductor chip having a preliminary semiconductor substrate, a plurality of through electrodes buried in the preliminary semiconductor substrate, a second wiring structure disposed on the preliminary semiconductor substrate, and a plurality of second front surface connection pads of which at least a portion is buried in the second wiring structure, such that the plurality of first front surface connection pads and the plurality of second front surface connection pads correspond to each other;
    forming a plurality of bonding pads by bonding together the plurality of first front surface connection pads and the plurality of second front surface connection pads in a corresponding manner; and
    forming a second semiconductor substrate having a horizontal width that is less than that of the second wiring structure, by removing a portion of the preliminary semiconductor substrate such that the plurality of through electrodes are exposed.

2. The method of claim 1, wherein the first semiconductor substrate has a first surface on which a first semiconductor device is disposed and a second surface opposite to the first surface, the second semiconductor substrate has a third surface on which a second semiconductor device is disposed and a fourth surface opposite to the third surface, wherein the third surface faces the first surface, and the preliminary semiconductor substrate includes the third surface and a fifth surface opposite to the third surface, and
    wherein the forming of the second semiconductor substrate comprises forming the second semiconductor substrate by removing a portion corresponding to a removal thickness from the fifth surface of the preliminary semiconductor substrate and a portion corresponding to a removal width from a side surface of the preliminary semiconductor substrate.

3. The method of claim 2, wherein the removal thickness is substantially equal to the removal width.

4. The method of claim 2, wherein each of the removal thickness and the removal width is greater than a thickness of the second semiconductor substrate.

5. The method of claim 2, wherein the forming of the second semiconductor substrate further comprises disposing the plurality of through electrodes to penetrate the second semiconductor substrate from first ends thereof to second ends thereof, such that the second ends of the plurality of through electrodes protrude from the fourth surface of the second semiconductor substrate.

6. The method of claim 5, further comprising:
    forming, on the wafer structure, a filling insulating layer covering the lower semiconductor chip and exposing the plurality of through electrodes; and
    forming the semiconductor package comprising the lower semiconductor chip and an upper semiconductor chip, the upper semiconductor chip being disposed on the lower semiconductor chip and being part of the wafer structure, by performing a sawing process on the wafer structure and the filling insulating layer.

7. The method of claim 6, wherein the forming of the tilling insulating layer comprises forming the filling insulating layer to at least partially surround a portion of the second semiconductor substrate protruding from the fourth surface, expose the second ends of the plurality of through electrodes, and cover a side surface of the second semiconductor substrate and a side surface of the second wiring structure.

8. The method of claim 6, wherein the forming of the semiconductor package comprises performing the sawing process such that a horizontal width of each of the first semiconductor substrate and the first wiring structure included in the upper semiconductor chip is greater than that of the second wiring structure.

9. The method of claim 6, further comprising forming, on the filling insulating layer and the plurality of through electrodes, a redistribution structure comprising a plurality of redistribution patterns electrically connected to the plurality of through electrodes,
    wherein the forming of the semiconductor package comprises sawing the redistribution structure together with the wafer structure and the filling insulating layer, such that the semiconductor package comprises the redistribution structure, the lower semiconductor chip disposed on the redistribution structure, and the upper semiconductor chip disposed on the lower semiconductor chip.

10. The method of claim 9, wherein the preparing of the wafer structure comprises disposing a plurality of via connection pads on the wafer structure, wherein at least a portion of the plurality of via connection pads is buried in the first wiring structure,
    wherein the method further comprises forming a plurality of through vias penetrating the filling insulating layer to connect to the plurality of via connection pads, and
    wherein the forming of the redistribution structure comprises forming some of the plurality of redistribution patterns to be electrically connected to the plurality of through vias.

11. A method of manufacturing a semiconductor package, the method comprising:
    preparing a wafer structure having a first semiconductor substrate on which a plurality of first semiconductor devices is disposed, a first wiring structure disposed on the first semiconductor substrate, and a plurality of first front surface connection pads of which at least a portion is buried in the first wiring structure;
    attaching, on the wafer structure, a plurality of lower semiconductor chips that are spaced apart from each other, the plurality of lower semiconductor chips each having a preliminary semiconductor substrate on which a second semiconductor device is disposed, a plurality of through electrodes buried in the preliminary semiconductor substrate, a second wiring structure disposed on the preliminary semiconductor substrate, and a plurality of second front surface connection pads of which at least portions are buried in the second wiring structure, such that the plurality of first front surface connection pads and the plurality of second front surface connection pads correspond to each other;
    forming a plurality of bonding pads by bonding together the plurality of first front surface connection pads and the plurality of second front surface connection pads corresponding to each other;
    forming a second semiconductor substrate having a horizontal width that is less than that of the second wiring, structure by removing a portion of the preliminary semiconductor substrate such that portions of the plurality of through electrodes protrude;
    forming, on the wafer structure, a filling insulating layer covering the plurality of lower semiconductor chips, at least partially surrounding protruding portions of the plurality of through electrodes, and exposing the plurality of through electrodes;
    forming, on the filling insulating layer and the plurality of through electrodes, a redistribution structure comprising a plurality of redistribution patterns electrically connected to the plurality of through electrodes; and
    forming a plurality of semiconductor packages each comprising one of the plurality of lower semiconductor chips and an upper semiconductor chip disposed on the one of the plurality of lower semiconductor chips and having one of the plurality of first semiconductor devices, by performing a sawing process on the wafer structure, the filling insulating layer, and the redistribution structure.

12. The method of claim 11, wherein the first wiring structure comprises a plurality of first wiring layers, a plurality of first via plugs, and a first wiring insulating layer at least partially surrounding the plurality of first wiring layers and the plurality of first via plugs,
    wherein the second wiring structure comprises a plurality of second wiring layers, a plurality of second via plugs, and a second wiring insulating layer at least partially surrounding the plurality of second wiring layers and the plurality of second via plugs, and
    wherein the forming of the plurality of bonding pads comprises forming the plurality of bonding pads such that a first portion of each of the plurality of bonding pads is buried in the first wiring insulating layer and a second portion of each of the plurality of bonding pads is buried in the second wiring insulating layer.

13. The method of claim 11, wherein the forming of the plurality of bonding pads comprises diffusion-bonding the plurality of first front surface connection pads to the plurality of second front surface connection pads through diffusion of metal atoms included therein, such that the plurality of first front surface connection pads and the plurality of second front surface connection pads corresponding to each other form a singular body.

14. The method of claim 11, wherein the forming of the second semiconductor substrate comprises forming the plurality of lower semiconductor chips to have a step shape and having a step difference at a boundary between the second semiconductor substrate and the second wiring structure.

15. The method of claim 11, wherein the forming of the second semiconductor substrate comprises forming a thickness of the second semiconductor substrate to be less than a separation distance between an edge of the second semiconductor substrate and an edge of the second wiring structure in a horizontal direction.

16. The method of claim 11, wherein the forming of the second semiconductor substrate comprises setting separation distances between corresponding edges from among four edges of each of the second semiconductor substrate and the second wiring structure to be substantially the same.

17. The method of claim 11, wherein the forming of the plurality of semiconductor packages comprises vertically aligning an edge of the second semiconductor substrate, an edge of the first wiring structure, an edge of the upper semiconductor chip, an edge of the filling insulating layer, and an edge of the redistribution structure of each of the plurality of semiconductor packages with each other, and
    positioning an edge of the second wiring structure further inside the semiconductor package than the edge of the first wiring structure.

18. A method of manufacturing a semiconductor package, the method comprising:
    preparing a wafer structure having a first semiconductor substrate on which a plurality of first semiconductor devices is disposed, a first wiring structure disposed on the first semiconductor substrate and having a first wiring insulating layer, and a plurality of first from surface connection pads of which side surfaces are covered by the first wiring insulating, layer;
    attaching, on the wafer structure, a plurality of lower semiconductor chips that are spaced apart from each other, the plurality of lower semiconductor chips each having a preliminary semiconductor substrate on which a second semiconductor device is disposed, a plurality of through electrodes buried in the preliminary semiconductor substrate, a second wiring structure disposed on the preliminary semiconductor substrate and having a second wiring insulating layer, and a plurality of second front surface connection pads of which side surfaces are covered by the second wiring insulating layer, such that the plurality of first front surface connection pads and the plurality of second front surface connection pads correspond to each other;

forming a plurality of bonding pads by bonding together the plurality of first front surface connection pads and the plurality of second front surface connection pads corresponding to each other, through diffusion bonding;

forming a second semiconductor substrate by removing a portion corresponding to a removal thickness from an upper surface of the preliminary semiconductor substrate and a portion corresponding to a removal width from a side surface of the preliminary semiconductor substrate, such that portions of the plurality of through electrodes protrude, wherein the second semiconductor substrate has an edge positioned further inside the semiconductor package than an edge of the second wiring structure and a thickness that is less than that of the removal width;

forming, on the wafer structure, a filling insulating layer at least partially surrounding protruding portions of the plurality of through electrodes, covering the plurality of lower semiconductor chips, and exposing the plurality of through electrodes;

forming, on the filling insulating layer and the plurality of through electrodes, a redistribution structure comprising a plurality of redistribution patterns electrically connected to the plurality of through electrodes; and forming a plurality of semiconductor packages each comprising one of the plurality of lower semiconductor chips and an upper semiconductor chip disposed on the one of the plurality of lower semiconductor chips and having one of the plurality of first semiconductor devices, by performing a sawing process on the wafer structure, the filling insulating layer, and the redistribution structure, such that an edge of the second semiconductor substrate, an edge of the first wiring structure, an edge of the upper semiconductor chip, an edge of the filling insulating layer, and an edge of the redistribution structure are aligned with each of the vertical direction.

19. The method of claim 18, wherein the removal thickness and the removal width each have a substantially value of about 15 µm to about 45 µm.

20. The method of claim 18, wherein the forming, of the second semiconductor substrate comprises allowing the removal width to be 2 to 4 times greater than a thickness of the second semiconductor substrate.

\* \* \* \* \*